United States Patent
Ko et al.

(10) Patent No.: US 9,586,226 B2
(45) Date of Patent: Mar. 7, 2017

(54) GAS CUSHION APPARATUS AND TECHNIQUES FOR SUBSTRATE COATING

(71) Applicant: Kateeva, Inc., Menlo Park, CA (US)

(72) Inventors: Alexander Sou-Kang Ko, Santa Clara, CA (US); Justin Mauck, Belmont, CA (US); Eliyahu Vronsky, Los Altos, CA (US); Conor F. Madigan, San Francisco, CA (US); Eugene Rabinovich, Fremont, CA (US); Nahid Harjee, Charlotte, NC (US); Christopher Buchner, Sunnyvale, CA (US); Gregory Lewis, Mountainview, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 14/697,370

(22) Filed: Apr. 27, 2015

(65) Prior Publication Data
US 2015/0314325 A1    Nov. 5, 2015

Related U.S. Application Data

(60) Provisional application No. 61/986,868, filed on Apr. 30, 2014, provisional application No. 62/002,384, filed on May 23, 2014.

(51) Int. Cl.
*B05C 13/00* (2006.01)
*B05C 5/00* (2006.01)
(Continued)

(52) U.S. Cl.
CPC .............. *B05B 15/06* (2013.01); *B05C 13/00* (2013.01); *B05C 15/00* (2013.01); *B05D 3/0254* (2013.01);
(Continued)

(58) Field of Classification Search
USPC ........ 118/313–315, 62, 63, 500; 347/56, 30, 347/25, 84, 97, 40, 104, 105, 108
See application file for complete search history.

(56) References Cited

U.S. PATENT DOCUMENTS 3,216,858 A    11/1965  Bogdanowski
3,498,343 A     3/1970  Sperberg
(Continued)

FOREIGN PATENT DOCUMENTS

CN    101911281 B    8/2012
CN    102983289 A    3/2013
(Continued)

OTHER PUBLICATIONS

Notice of Allowance issued on Dec. 16, 2015, to U.S. Appl. No. 14/727,602.
(Continued)

*Primary Examiner* — Yewebdar Tadesse

(57) ABSTRACT

A coating can be provided on a substrate. Fabrication of the coating can include forming a solid layer in a specified region of the substrate while supporting the substrate in a coating system using a gas cushion. For example, a liquid coating can be printed over the specified region while the substrate is supported by the gas cushion. The substrate can be held for a specified duration after the printing the patterned liquid. The substrate can be conveyed to a treatment zone while supported using the gas cushion. The liquid coating can be treated to provide the solid layer including continuing to support the substrate using the gas cushion.

13 Claims, 20 Drawing Sheets

(51) Int. Cl.

| | | |
|---|---|---|
| *B05B 15/06* | (2006.01) | |
| *B05D 3/06* | (2006.01) | |
| *B05D 3/02* | (2006.01) | |
| *H01L 51/00* | (2006.01) | |
| *B41J 3/407* | (2006.01) | |
| *B05C 15/00* | (2006.01) | |
| *C23C 14/00* | (2006.01) | |
| *H01L 21/67* | (2006.01) | |
| *H01L 21/677* | (2006.01) | |
| *H01L 21/683* | (2006.01) | |
| *H01L 23/532* | (2006.01) | |
| *H05K 3/00* | (2006.01) | |
| *H01L 21/48* | (2006.01) | |

(52) U.S. Cl.
CPC .............. *B05D 3/065* (2013.01); *B41J 3/407* (2013.01); *C23C 14/00* (2013.01); *H01L 21/6715* (2013.01); *H01L 21/67017* (2013.01); *H01L 21/67161* (2013.01); *H01L 21/67196* (2013.01); *H01L 21/67207* (2013.01); *H01L 21/67248* (2013.01); *H01L 21/67739* (2013.01); *H01L 21/67784* (2013.01); *H01L 21/67787* (2013.01); *H01L 21/6838* (2013.01); *H01L 51/00* (2013.01); *H01L 21/4867* (2013.01); *H01L 23/5328* (2013.01); *H01L 2924/0002* (2013.01); *H05K 3/0091* (2013.01)

(56) References Cited

U.S. PATENT DOCUMENTS

| | | | |
|---|---|---|---|
| 3,670,466 A | 6/1972 | Lynch | |
| 3,885,362 A | 5/1975 | Pollock | |
| 4,581,478 A | 4/1986 | Pugh et al. | |
| 5,016,363 A * | 5/1991 | Krieger .................. | B65H 23/24 |
| | | | 34/641 |
| 5,029,518 A | 7/1991 | Austin | |
| 5,314,377 A | 5/1994 | Pelosi, III | |
| 5,344,365 A | 9/1994 | Scott et al. | |
| 6,023,899 A | 2/2000 | Mecozzi | |
| 6,049,167 A | 4/2000 | Onitsuka et al. | |
| 6,089,282 A | 7/2000 | Spiegelmann et al. | |
| 6,375,304 B1 | 4/2002 | Aldrich et al. | |
| 6,939,212 B1 | 9/2005 | Pham | |
| 7,258,768 B2 | 8/2007 | Yamazaki | |
| 7,326,300 B2 | 2/2008 | Sun et al. | |
| 7,703,911 B2 | 4/2010 | Chung et al. | |
| 8,383,202 B2 | 2/2013 | Somekh et al. | |
| 9,343,678 B2 * | 5/2016 | Ko ..................... | H01L 51/5253 |
| 2002/0053589 A1 | 5/2002 | Owen et al. | |
| 2002/0079057 A1 | 6/2002 | Yoshioka et al. | |
| 2002/0084464 A1 | 7/2002 | Yamazaki et al. | |
| 2002/0124906 A1 | 9/2002 | Suzuki et al. | |
| 2003/0000476 A1 | 1/2003 | Matsunaga et al. | |
| 2003/0097929 A1 | 5/2003 | Watanabe et al. | |
| 2003/0175414 A1 | 9/2003 | Hayashi | |
| 2003/0196597 A1 | 10/2003 | Yamazaki et al. | |
| 2004/0021762 A1 | 2/2004 | Seki et al. | |
| 2004/0075112 A1 | 4/2004 | Yamazaki et al. | |
| 2004/0115339 A1 | 6/2004 | Ito | |
| 2004/0206307 A1 | 10/2004 | Boroson et al. | |
| 2005/0005850 A1 | 1/2005 | Yamazaki | |
| 2005/0062773 A1 | 3/2005 | Fouet | |
| 2005/0140764 A1 | 6/2005 | Chang et al. | |
| 2005/0223994 A1 | 10/2005 | Blomiley et al. | |
| 2006/0008591 A1 | 1/2006 | Sun et al. | |
| 2006/0096395 A1 | 5/2006 | Weiss et al. | |
| 2006/0099328 A1 | 5/2006 | Waite et al. | |
| 2006/0219605 A1 | 10/2006 | Devitt | |
| 2006/0236938 A1 | 10/2006 | Powell et al. | |
| 2006/0274096 A1 * | 12/2006 | Kanda .................. | B41J 2/17509 |
| | | | 347/14 |
| 2007/0024686 A1 * | 2/2007 | Kadomatsu ................ | B41J 2/15 |
| | | | 347/102 |
| 2007/0044713 A1 | 3/2007 | Yasui et al. | |
| 2007/0195653 A1 | 8/2007 | Yassour et al. | |
| 2007/0257033 A1 | 11/2007 | Yamada | |
| 2008/0241587 A1 | 10/2008 | Ohmi et al. | |
| 2008/0273072 A1 | 11/2008 | Chung et al. | |
| 2009/0081885 A1 | 3/2009 | Levy et al. | |
| 2009/0244510 A1 | 10/2009 | Domanowski | |
| 2009/0295857 A1 * | 12/2009 | Kikuchi ..................... | B41J 2/14 |
| | | | 347/16 |
| 2009/0326703 A1 | 12/2009 | Presley et al. | |
| 2010/0201749 A1 * | 8/2010 | Somekh .............. | B05B 17/0638 |
| | | | 347/56 |
| 2010/0255184 A1 | 10/2010 | Yamazaki et al. | |
| 2010/0282271 A1 | 11/2010 | Devitt | |
| 2011/0100394 A1 | 5/2011 | Yi et al. | |
| 2012/0089180 A1 | 4/2012 | Fathi et al. | |
| 2012/0128890 A1 | 5/2012 | Mirchev | |
| 2012/0306951 A1 | 12/2012 | Somekh et al. | |
| 2012/0326139 A1 | 12/2012 | Chen | |
| 2013/0040061 A1 | 2/2013 | Lowrance et al. | |
| 2013/0164438 A1 | 6/2013 | Somekh et al. | |
| 2013/0164439 A1 | 6/2013 | Somekh et al. | |
| 2013/0203269 A1 | 8/2013 | Yokouchi | |
| 2013/0206058 A1 | 8/2013 | Mauck et al. | |
| 2013/0209669 A1 | 8/2013 | Somekh et al. | |
| 2013/0209670 A1 | 8/2013 | Somekh et al. | |
| 2013/0209671 A1 | 8/2013 | Somekh et al. | |
| 2013/0252533 A1 | 9/2013 | Mauck et al. | |
| 2013/0258709 A1 | 10/2013 | Thompson et al. | |
| 2013/0307898 A1 | 11/2013 | Somekh et al. | |
| 2014/0311405 A1 | 10/2014 | Mauck et al. | |
| 2015/0259786 A1 | 9/2015 | Ko et al. | |

FOREIGN PATENT DOCUMENTS

| | | |
|---|---|---|
| JP | 2003270417 | 9/2003 |
| JP | 201369701 | 4/2013 |
| JP | 2013175486 | 9/2013 |
| KR | 1020060031968 | 4/2006 |
| KR | 1020080026168 | 3/2008 |
| KR | 1020110058008 | 6/2011 |
| KR | 1020120001852 | 1/2012 |
| WO | WO 2006/021568 | 3/2006 |
| WO | WO 2015/112454 | 7/2015 |

OTHER PUBLICATIONS

Examiner-Initiated Interview Summary dated Dec. 10, 2015, for U.S. Appl. No. 14/727,602.
International Search Report and Written Opinion issued on Feb. 26, 2013 for PCT Application No. PCT/US12/70717.
International Search Report and Written Opinion issued on Jun. 18, 2013 for PCT Application No. PCT/US13/031083.
International Search Report and Written Opinion issued on Apr. 17, 2015, to PCT Application PCT/US2015/11854.
International Search Report and Written Opinion issued on Aug. 4, 2015, to PCT Application PCT/US2015/27835.
Non-Final Office Action issued on Jun. 14, 2012, to U.S. Appl. No. 12/652,040.
Applicant-Initiated Interview Summary dated Oct. 19, 2012 for U.S. Appl. No. 12/652,040.
Non-Final Office Action issued on Apr. 24, 2013, to U.S. Appl. No. 13/551,209.
Applicant-Initiated Interview Summary dated Aug. 15, 2013 for U.S. Appl. No. 13/551,209.
Final Office Action issued on Nov. 8, 2013, to U.S. Appl. No. 13/551,209.
Non-Final Office Action issued on Feb. 7, 2014, to U.S. Appl. No. 13/773,643.
Final Office Action issued on Jun. 12, 2014, to U.S. Appl. No. 13/773,643.
Non-Final Office Action issued on Feb. 28, 2014, to U.S. Appl. No. 13/773,649.

(56) References Cited

OTHER PUBLICATIONS

Final Office Action issued on Jun. 10, 2014, to U.S. Appl. No. 13/773,649.
Non-Final Office Action issued on Dec. 31, 2013, to U.S. Appl. No. 13/774,577.
Final Office Action issued on Jun. 18, 2014, to U.S. Appl. No. 13/774,577.
Non-Final Office Action issued on Apr. 28, 2014, to U.S. Appl. No. 13/720,830.
Applicant-Initiated Interview Summary dated Jun. 30, 2014 for U.S. Appl. No. 13/720,830.
Non-Final Office Action issued on May 16, 2014, to U.S. Appl. No. 13/802,304.
Applicant-Initiated Interview Summary dated Aug. 20, 2014 for U.S. Appl. No. 13/802,304.
Non-Final Office Action issued on Aug. 3, 2015, to U.S. Appl. No. 14/727,602.
European Supplemental Search Report issued Nov. 7, 2016 for EP Application No. 15740186.0.
First Office Action issued on Aug. 23, 2016 for CN Application No. 201580002316.7.
Non-Final Office Action issue on May 6, 2016 to U.S. Appl. No. 15/047,458.
Notice of Provisional Rejection issued on Oct. 14, 2016 for KR Application No. 10-2016-7015302.
Office Action issued on Oct. 11, 2016 for JP 2016-528850.

* cited by examiner

GAS CUSHION APPARATUS AND TECHNIQUES FOR SUBSTRATE COATING

CLAIM OF PRIORITY

This patent application claims benefit of priority of each of (1) U.S. Provisional Patent Application Ser. No. 61/986,868, titled "Systems and Methods for the Fabrication of Inkjet Printed Encapsulation Layers," filed on Apr. 30, 2014; and (2) U.S. Provisional Patent Application Ser. No. 62/002,384, titled "DISPLAY DEVICE FABRICATION SYSTEMS AND TECHNIQUES USING INERT ENVIRONMENT," filed on May 23, 2014, each of which is hereby incorporated herein by reference in its entirety.

BACKGROUND

Material layers can be formed on a substrate, such as to provide one or more functional or non-functional layers of an electronic device. In one approach, film layers on such devices can be fabricated in part via vacuum deposition of a series of thin films onto the substrate using any of a number of techniques, including without limitation, chemical vapor deposition, plasma enhanced chemical vapor deposition, sputtering, electronic beam evaporation, and thermal evaporation. However vacuum processing in this manner is relatively: (1) complex, generally involving a large vacuum chamber and pumping subsystem to maintain such vacuum; (2) wasteful of the raw material being deposited, because a large fraction of the material in such a system is generally deposited onto the walls and fixtures of the interior of the deposition chamber, such that more material is generally wasted than deposited onto the substrate; and (3) difficult to maintain, such as involving frequently stopping the operation of the vacuum deposition tool to open and clean the walls and fixtures of built-up waste material. In the case of substrates larger in surface area than generally available silicon wafers, these issues present further challenges.

In certain applications, it can be desirable to deposit a film in a specified pattern. In another approach, a blanket coating can be deposited over the substrate and photolithography can be considered for achieving desired patterning. But, in various applications, such photolithography processes can damage existing deposited film layers. A so-called shadowmask can be used to pattern a deposited layer directly when using a vacuum deposition technique. The shadowmask in such cases comprises a physical stencil with cut-outs for the deposition regions that can be, for example, manufactured out of a metal sheet. The shadowmask is generally aligned to, and placed in proximity to or in contact with, the substrate prior to deposition, kept in place during deposition, and then removed after deposition.

Such direct-patterning via shadowmask adds substantial complexity to vacuum-based deposition techniques, generally involving additional mechanisms and fixturing to handle and position the mask precisely relative to the substrate, further increasing the material waste (due to the waste from material deposited onto the shadowmask), and further increasing a need for maintenance to continuously clean and replace the shadowmasks. Such thin masks can be mechanically unstable over large areas, limiting the maximum size of substrate that can be processed, and it is therefore the case that again, for substrates larger in surface area than generally available silicon wafers, these issues are especially challenging.

DETAILED DESCRIPTION

Figure 1:
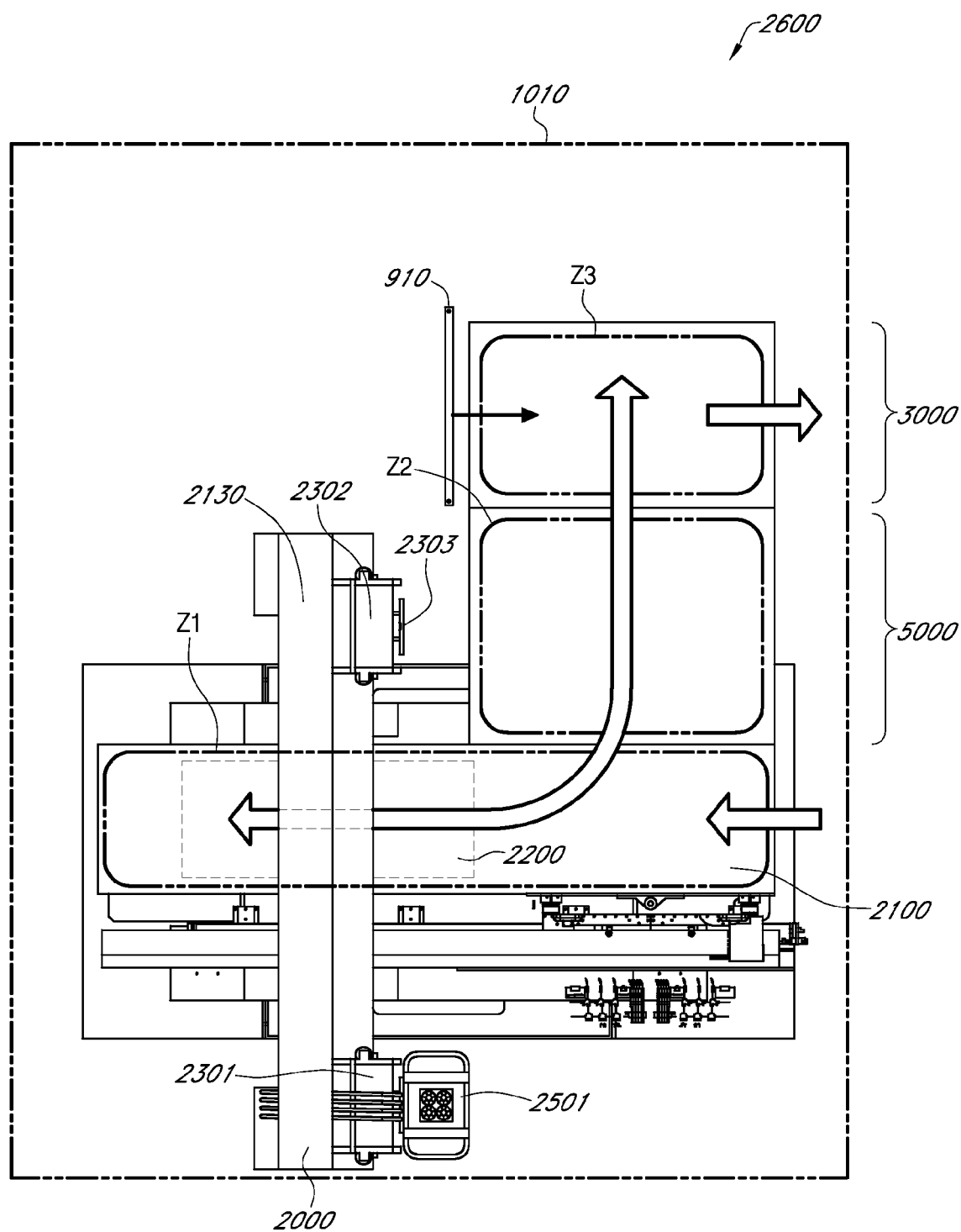
FIG. 1 illustrates generally an example of a plan view of at least a portion of a coating system.

Embodiments of an enclosed coating system according to the present teachings can be useful for coating of substrates in the manufacture of a variety of apparatuses and devices in a wide range of technology areas, for example, but not limited by, organic light emitting diode (OLED) displays, OLED lighting, organic photovoltaics, Perovskite solar cells, printed circuit boards, and organic and inorganic semiconductor devices or circuits.

The present inventors have recognized, among other things, that a solid layer can be formed on a substrate at an ambient pressure at or near atmospheric pressure, such as using a printing technique to deposit a liquid ink over a specified region of the substrate, and treating the liquid ink to solidify the liquid ink to provide the solid layer, including supporting the substrate at least in part using a gas cushion during such printing, and including continuing to the support the substrate at least in part using the gas cushion during the treatment of the liquid ink. The present inventors have also recognized, among other things, that in this manner a number of handling steps can be reduced, such as for one or more of reducing latency, reducing mechanical damage to the substrate during engagement, for example, by a handler, or enhancing uniformity of a solid layer provided by various embodiments of a coating system of the present teachings. Various processes that can be performed in embodiments of a coating system of the present teachings can include holding the substrate for a specified duration after such printing and before treatment of the liquid ink, including continuing to support the substrate at least in part using the gas cushion during various processes performed.

Broadly, the printing operation can include one or more liquid coating processes, such as inkjet printing, nozzle printing, slot die coating (patterned or un-patterned), or screen printing, and the liquid ink can comprise one or more of an organic material (e.g., a monomer or a polymer) or an inorganic material, and can include a carrier fluid. Treatment of the liquid ink can include one or more of light exposure (e.g., including one or more of ultraviolet, infra-red, or visible light), heating or cooling, higher-than-ambient pressure or vacuum. Such treatment can result in solidification of liquid ink to provide the solid layer through one or more of removal of a carrier fluid (e.g., one or more of drying or baking, such as including vacuum drying or vacuum baking), chemical reaction (e.g., cross linking or chemical transformation from one compound to another), or densification (e.g., baking, such as including vacuum baking). The printed layer can be patterned or blanket coated over the substrate, and can coat or can be included as part of a light emitting device (e.g., a display or lighting panel), a light absorbing device (e.g., photodetector or solar cell), a printed circuit assembly, or other electronic device or circuit.

The present inventors have recognized, among other things, that printing techniques and other processing operations can be carried out using systems having enclosures configured to provide a controlled environment, such as including an atmosphere comprising a gas that is minimally reactive or non-reactive with one or more species deposited upon or comprising a substrate being processed, such gas having a specified purity level. Such a specified purity level can also include controlled maximum impurity concentrations of species reactive to various materials and components of devices manufactured using embodiments of coating systems of the present teachings, such as, for example, but not limited by oxygen, ozone, and water vapor, as well as various organic solvent vapors. Controlling various reactive species to a specified purity level can prevent degradation of materials and devices being fabricated upon the substrate during fabrication, reduce or prevent the incorporation of impurities into the materials and devices being fabricated upon the substrate during fabrication that may subsequently cause, accelerate, or facilitate the degradation of such materials or devices after fabrication, or to inhibit or suppress defects. Particulate controls can also be provided, such as to maintain a specified particulate level within the controlled environment.

The arrangement of enclosures can include respective modules having individually-maintained controlled environments, or one or more of the modules can share a controlled environment with other modules. Facilities such as gas purification, temperature control, solvent abatement, or particulate control can be shared between modules or can be provided in a dedicated manner. Various examples of a gas purification according to the present teachings can include maintaining levels for various reactive species, including various reactive atmospheric gases, such as water vapor, oxygen, ozone, as well as organic solvent vapors at 1000 ppm or lower, for example, at 100 ppm or lower, at 10 ppm or lower, at 1.0 ppm or lower, or at 0.1 ppm or lower.

Various devices, such as electronic or optoelectronic devices, can be fabricated using organic materials, including using processing techniques to provide one or more film layers. Organic optoelectronic devices can be volumetrically compact because of their relatively thin and planar structure, along with providing enhanced power efficiency and enhanced visual performance, such as compared to other display technologies. Such devices can be mechanically flexible (e.g., foldable or bendable), or optically transparent, unlike competing technologies. Applications for an organic optoelectronic device can include general illumination, use as a backlight illumination source, or use as a pixel light source or other element in an electroluminescent display, for example. One class of organic optoelectronic devices includes organic light emitting diode (OLED) devices, which can generate light using electroluminescent emissive organic materials such as small molecules, polymers, fluorescent, or phosphorescent materials, for example.

In an example, the printing operation can include inkjet printing a liquid ink comprising an organic material, and the treating the liquid ink can include exposing the liquid ink to light, such as ultraviolet (UV) light, to cure the liquid ink to provide the solid layer. A curing process, such as including UV illumination, can induce a cross linking reaction, thereby forming a patterned solid layer. For example, the patterned solid layer can coat at least a portion of a light-emitting device or other device fabricated upon the substrate. The solid layer can encapsulate a specified region on the substrate, such as included in a stack of layers forming an encapsulating structure.

The systems and techniques described herein can be used in support of processing a range of different substrate configurations. For example, a flat panel display device can be fabricated at least in part using systems or techniques described herein. Such a flat panel display device can include an organic light emitting diode (OLED) flat panel display. Several OLED flat panel displays can be processed on a substrate. Use of the word "substrate" or the phrase "substrate being fabricated" refers generally to an assembly in-process, such as can include an OLED device. The examples herein need not be restricted to a particular panel geometry or size. For example, such systems and techniques can be used in support of fabrication of display devices on substrates having a generation 2 ("Gen 2") size, such as having a rectangular geometry including dimensions of about 37 centimeters (cm) by about 47 cm. The systems described herein can also be used for somewhat larger substrate geometries, such as in support of fabrication of display devices on substrates having a generation 3.5 ("Gen 3.5") substrate size, such as having a rectangular geometry including dimensions of about 61 centimeters (cm) by about 72 cm. The systems described herein can also be used for even larger substrate geometries, such as in support of fabrication of display devices on substrates having a substrate size corresponding to "Gen 5.5," having dimensions of about 130 cm×150 cm, or a "Gen 7" or "Gen 7.5" substrate, having dimensions of about 195 cm×225 cm. For example, a Gen 7 or Gen 7.5 substrate can be singulated (e.g., cut or otherwise separated) into eight 42 inch (diagonal dimension) or six 47 inch (diagonal dimension) flat panel displays. A "Gen 8" substrate can include dimensions of about 216×246 cm. A "Gen 8.5" substrate can include dimensions of about 220 cm×250 cm, and can be singulated to provide six 55 inch or eight 46 inch flat panels per substrate.

Dimensions beyond Gen 8.5 can be supported using systems and techniques described herein. For example, a "Gen 10" substrate having dimensions of about 285 cm×305 cm, or beyond, can be fabricated at least in part using systems and techniques described herein. The panel sizes described herein, while generally applicable to glass substrates, can applied to substrates of any material suitable for use in display device fabrication, and in particular OLED display fabrication that can include forming one or more layers using printing techniques. For example, a variety of glass substrate materials can be used, as well as a variety of polymeric substrate materials, for example, polyimide.

FIG. 1 illustrates generally an example of a plan view of at least a portion of a coating system 2600. The system 2600 can be configured to provide a solid layer in a specified region of a substrate, such as a first side of a substrate facing upward. The solid layer can coat at least a portion of the substrate, such as formed in a specified pattern. The system 2600 can include an arrangement of zones, such as each configured to support the substrate at least in part using a gas cushion arrangement using pressurized gas provided to a second side of the substrate opposite the first side. For example, the solid layer can be patterned or blanket coated over the substrate, and can coat or can be included as part of a light emitting device (e.g., a display or lighting panel), a light absorbing device (e.g., photodetector or solar cell), a printed circuit assembly, or other electronic device or circuit.

The coating system 2600 can include a printing system 2000, such as can include an inkjet printhead configured to deposit a liquid coating over the specified region of the substrate (e.g., providing a blanket or patterned liquid coating). For example, the printing system 2000 can include apparatus for reliable placement of ink drops onto specific locations on a substrate. Such apparatus can include a one or more of a printhead assembly 2501, ink delivery system, substrate support apparatus such as a platform (e.g., a floatation "table") to provide the pressurized gas, loading and unloading apparatus, and facilities for management of the printhead.

In the illustrative example of FIG. 1, the printing system 2000 can include a bridge 2130, such as attached to risers. The bridge can support a first carriage assembly 2301 and a second carriage assembly 2302, where such carriages are movable in at least one axis (e.g., an "X-axis") along the bridge 2130. The first carriage assembly can control movement of the printhead assembly 2501 across the bridge 2130, such as using a linear air bearing motion system, which can be intrinsically low-particle generating. In an example, one or more of the first or second carriage assemblies 2301 or 2302 can have a vertical (e.g., "Z-axis") moving plate mounted thereupon. In an example, the first and second carriage assemblies 2301 and 2302 can each carry a printhead assembly. In another example, such as shown in FIG. 1, the first carriage assembly 2301 can carry the printhead assembly 2501, and the second carriage assembly 2302 can carry one or more cameras, such as a camera 2303 for monitoring or inspection of a substrate coating operation.

Each printhead assembly, such as the printhead assembly 2501, can have a plurality of printheads mounted in at least one printhead device. A printhead device can include, for example, but not limited by, fluidic and electronic connections to at least one printhead; each printhead having a plurality of nozzles or orifices capable of ejecting ink at a controlled rate, velocity and size. For example, the printhead assembly 2501 can include between about 1 to about 60 printhead devices, where each printhead device can have between about 1 to about 30 printheads in each printhead device. A printhead, for example, an industrial inkjet head, can have between about 16 to about 2048 nozzles, which can expel a droplet volume of between about 0.1 picoliters (pL) to about 200 pL, according to an illustrative example.

As mentioned above, the printing operation can include one or more liquid coating processes, such as inkjet printing, nozzle printing, slot die coating (patterned or un-patterned), or screen printing, and the liquid ink can comprise one or more of an organic material (e.g., a monomer or a polymer) or an inorganic material, and can include a carrier fluid. Treatment of the liquid ink can include one or more of light exposure (e.g., including one or more of ultraviolet, infrared, or visible light), heating or cooling, higher-than-ambient pressure or vacuum. Such treatment can result in solidification of liquid ink to provide the solid layer through one or more of removal of a carrier fluid (e.g., one or more of drying or baking, such as including vacuum drying or vacuum baking), chemical reaction (e.g., cross linking or chemical transformation from one compound to another), or densification (e.g., baking, such as including vacuum baking). In another approach, a solid-phase material can be vaporized thermally for deposition onto a substrate through a jet. In yet another approach, material can be dissolved or otherwise suspended in a carrier liquid, and a layer including the material can be formed by dispensing a continuous stream on fluid from a nozzle onto a substrate to form a line (so-called "nozzle printing" or "nozzle jet") and subsequent evaporation of the carrier to provide a line patterned layer.

A region 2100 can be accessed by a handler (e.g., a transfer robot), such as to allow placement of a substrate in the region 2100 of a first zone Z1 before printing the liquid coating (e.g., as indicated by an arrow toward the region 2100). The substrate can then be supported at least in part by pressurized gas such as in the region 2100 of the first zone Z1. The printing system can have a second region 2200 in the first zone Z1, such as providing a combination of pressurized gas and vacuum to more precisely control a floatation "fly height" of the substrate, such as during or after a printing operation. Further discussion of using pressure-only or a combination of pressure and vacuum is provided in relation to the illustrative example of FIG. 7, below.

Referring back to FIG. 1, the substrate can be conveyed at least in part using a floatation table located in the first zone Z1. Such conveyance can be augmented or otherwise facilitated by mechanical engagement of the substrate, such as including use of one or more of rollers or grippers (e.g., a vacuum gripper), as discussed further in examples below. One or more of the first, second, or third zones Z1, Z2, or Z3 can be configured to continuously support the substrate at least in part using a gas cushion. For example, after a printing operation, the substrate can be conveyed to a third zone Z3 included as a portion of a treatment system 3000, such as via a second zone Z2, such as along a path indicated by the curved line including arrows. Such conveyance can include continuing to support the substrate at least in part using the gas cushion during conveyance and through treatment. The treatment system 3000 can treat a liquid coating (e.g., a printed liquid ink) to provide a solid layer on the substrate.

As mentioned above, treatment of the liquid ink can include one or more of light exposure (e.g., including one or more of ultraviolet, infra-red, or visible light), heating or cooling, higher-than-ambient pressure or vacuum. Such treatment can result in solidification of liquid ink to provide the solid layer through one or more of removal of a carrier fluid (e.g., one or more of drying or baking, such as including vacuum drying or vacuum baking), chemical reaction (e.g., cross linking or chemical transformation from one compound to another), or densification (e.g., baking, such as including vacuum baking). The printed layer can be patterned or blanket coated over the substrate, and can coat or can be included as part of a light emitting device (e.g., a display or lighting panel), alight absorbing device (e.g., photodetector or solar cell), a printed circuit assembly, or other electronic device or circuit.

For example, the treatment system 3000 can include one or more sources of light (e.g., one or more visible, infra-red, or ultraviolet sources such as a source 910). The source 910 can include a linear array of "bar" source, such as can include an array of ultraviolet light-emitting diodes, as discussed in relation to other examples herein. One or more of the substrate or the source 910 can be translated or scanned, such as to achieve a desired controlled duration or dose of light exposure over a specified region of the substrate. Such light exposure can be used to heat a substrate (e.g., using infra-red or visible light), or to elicit a chemical reaction (e.g., cross linking or chemical transformation). The treatment need not include using light. For example, the treatment system 3000 can be configured to heat or cool the substrate, or to provide an environment for the substrate to evolve from one state to another.

For example, treatment can include baking or drying the substrate using heating. Such heating can be one or more of convectively-driven (e.g., using the gas cushion or establishing other gas flow) or radiatively driven (e.g., using one or more sources such as lamps providing infrared radiation). As discussed in other examples below, a temperature of the substrate during treatment in the treatment zone 3000 or elsewhere can be controlled, such as using one or more of the controlled application of temperature-controlled gas flow across the substrate surface, such as laminar flow, which can be provided to flow across the plane of the substrate, or using a temperature-controlled flow provided as a portion of the gas cushion used to support the substrate. Such convective techniques can be used to treat the substrate to bake or dry the liquid coating to solidify the liquid coating, providing the solid layer. Such convective techniques can be combined with radiative treatment, such as can include using infra-red lamps to one or more of bake or dry the liquid coating. Treatment can include providing environment to densify one or more layers on the substrate, such as can including a baking operation. In another example, at least a partial vacuum environment can be used during treatment, such as can also include radiative treatment of the substrate.

In an example, the substrate can be held for a specified duration (or until specified criteria are met), after a printing operation but before a treatment operation, such as to allow the substrate to evolve from one condition to another. In the case of holding for the purpose of evolving the substrate, for example, the substrate can be held so as to allow for a printed liquid layer to settle or flow. As in the example above, a temperature of the substrate during such evolution can be controlled through the controlled application of temperature-controlled gas flow across the substrate surface, such as laminar flow, which can be provided to flow across the plane of the substrate.

Holding can be performed with the substrate located in either of regions 2100 or 2200 of the first zone Z1. For example, a first substrate can be kept stationary in the printing zone Z1 after a printing operation for a specified holding duration. However, throughput can be enhanced such as by conveying a substrate to the second zone Z2 and using at least a portion of the second zone Z2 as a holding zone or to perform one or more other operations. For example, another substrate can be delivered to the first zone Z1 of the system 2600 for a printing operation and the first substrate can be conveyed to the second zone Z2 to vacate the region where printing occurs. If the second zone is elongated, a series of substrates can be held or conveyed serially through zone Z2. The second zone Z2 can also be used for queueing or buffering a series of substrates awaiting treatment or other processing (e.g., the substrates need not be held in zone Z2 only for a specified duration, or only for evolution from one state to another), or processing can be performed in the second zone Z2 such as can include one or more of baking or drying the substrate. Other configurations can be used, such as shown in the example of FIG. 2, FIG. 3A, FIG. 3B, FIG. 3C, or FIG. 3D. In addition or instead, the third zone Z3 can be used to hold the substrate for a specified duration after printing but before treatment.

The coating system 2600 can be located within an enclosure 1010, such as to provide a controlled processing environment at or near atmospheric pressure. Such a controlled processing environment can be established to remain below specified limits of one or more of particulate contamination level, water vapor content, oxygen content, ozone content and organic vapor content. For example, the controlled processing environment can include nitrogen or another gas or mixture of gases specified for minimal or no reactivity with a species deposited on a substrate being processed using the system 2600. As described in other examples below, such a controlled processing environment can be established at least in part using a gas purification system included within or coupled to various portions of the system 2600. A particulate level of the controlled environment can also be controlled, such as using apparatus coupled to the system 2600 or located within the system 2600. In an example, the enclosure 1010 can include an environment established without a pressurized inert gas recirculation system, such as can include an enclosure 1010 maintained at a slightly positive internal pressure relative to an external pressure in order to safeguard against outside gas or air from entering the interior should any leaks develop in the enclosure 1010. According to various illustrative examples, an enclosure 1010 and system 2600 of the present teachings, the interior of the enclosure 1010 can be maintained at a pressure relative to the surrounding atmosphere external to the enclosure 1010, for example, of at least 2 mbarg, for example, at a pressure of at least 4 mbarg, at a pressure of at least 6 mbarg, at a pressure of at least 8 mbarg, or at a higher pressure.

Figure 2:
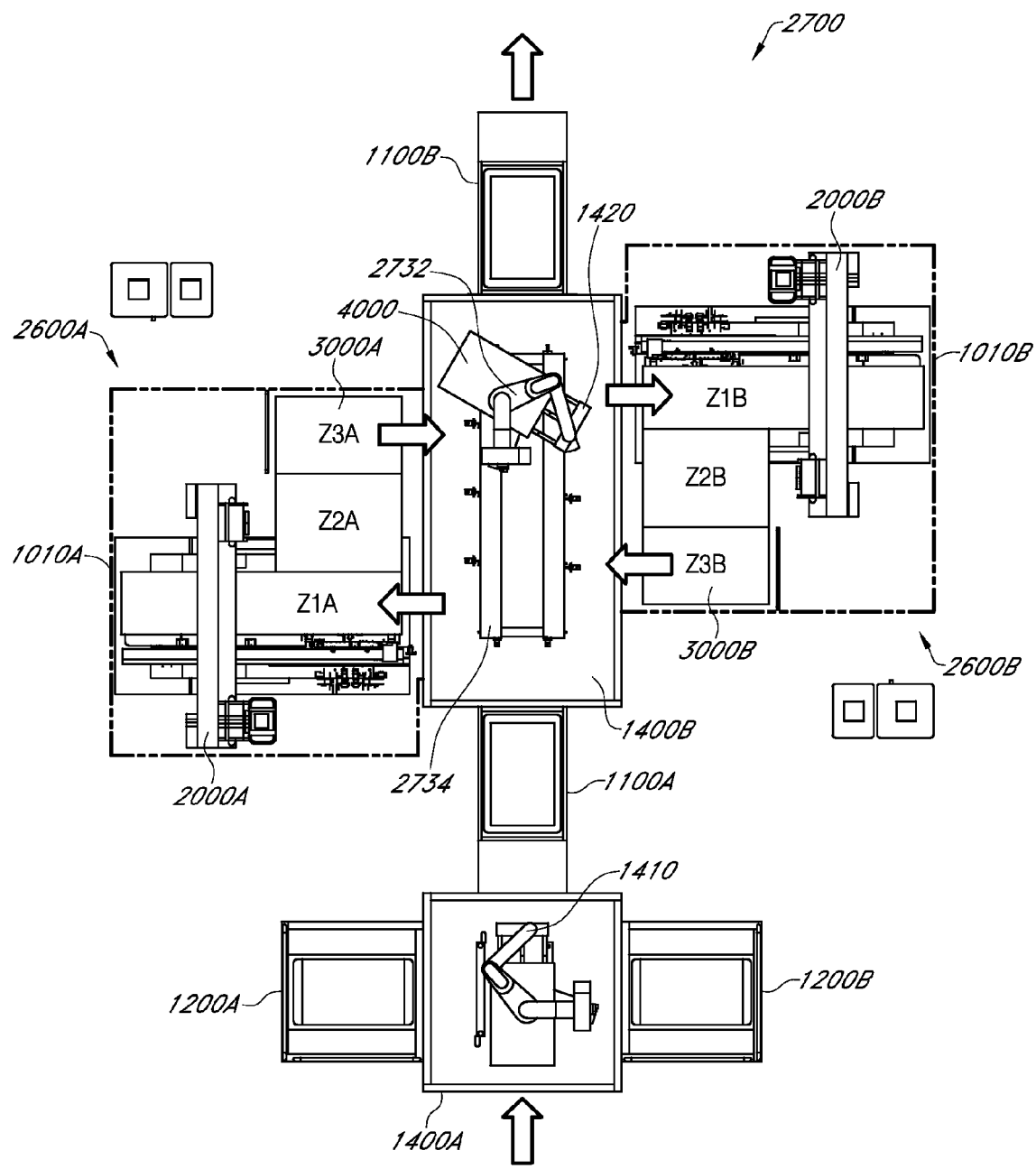
FIG. 2 illustrates generally an example of a plan view of at least a portion of a coating system, such as can include two or more printing zones and treatment zones.

FIG. 2 illustrates generally an example of a plan view of at least a portion of a coating system 2700, such as can include two or more printing zones and treatment zones. FIG. 2 can include two or more coating systems 2600A or 2600B, such as each having a configuration identical or similar to the configuration of the system 2600 discussed above in relation to FIG. 1. In FIG. 2, a substrate 4000 can be transported into a zone Z1A of a first coating system 2600A, such as supported at least in part using a gas cushion provided by a floatation table in a printing zone Z1A during a printing process. For example, a handler 2732 including an end effector 1420 can be used to manipulate the substrate 4000, such as to place the substrate 4000 in position for printing or treatment operations in zone Z1A, or to retrieve a substrate after such operations, such as from zone Z3A. In the illustrative example of FIG. 2, the handler 2732 can traverse a track 2734 in addition to having other degrees of freedom.

The substrate 4000 can be transferred within the coating system 2600A using a floatation stage conveyance system, such as through a second zone Z2A, using various transport techniques. Such techniques can include using one or more of a linear air bearing or mechanical bearing system, a gripper assembly for holding the substrate, rollers, or the like. As previously discussed herein, the substrate 4000 can be retained in a holding zone for a specified hold duration or for a duration determined by a latency of other processing activities, such as after a printing process has been completed and before a treatment operation. During such a holding operation, the substrate 4000 can continue to be supported at least in part using a gas cushion.

The substrate 4000 can be transported to a treatment zone Z3A, such as included as a portion of a treatment system 3000A. As discussed elsewhere herein, a substrate 4000 can be treated using various techniques such as to form a solid layer by solidfying the liquid layer. Such treatment can result in solidification of liquid ink to provide the solid layer through one or more of removal of a carrier fluid (e.g., one or more of drying or baking, such as including vacuum drying or vacuum baking), chemical reaction (e.g., cross linking or chemical transformation from one compound to another), or densification (e.g., baking, such as including vacuum baking). During processing within the coating system 2600A, the substrate 4000 can be supported at least in part using a gas cushion during an entire sequence of processing operations including one or more of printing, holding, and treatment.

The present inventors have recognized, among other things, that in this manner a number of handling steps including a robot (e.g., a handler 2732) can be reduced, such as for one or more of reducing latency, reducing mechanical damage to the substrate during engagement by the handler 2713, or enhancing uniformity of a solid layer (e.g., a film layer) provided by the coating system 2600A. The various transport techniques mentioned above can be used to convey a substrate through the coating system 2600A, such as contacting the substrate in specified regions other than a display region or area of a substrate including electronic devices being fabricated, or supporting the substrate at least in part using a gas cushion opposite such regions.

The system 2700 can include a second coating system 2600B, such as configured similarly to the first coating system 2600A, such as include first, second, and third zones Z1B, Z2B, and Z3B, along with a printing system 2000B, and a treatment system 3000B. The second coating system 2600B can be configured to print a liquid layer, and then treat the liquid layer to provide a solid layer in a manner similar to the first coating system 2600B. In this manner, the second coating system 2600B can provide one or more of redundancy or enhanced throughput as compared to a topology having only a single printing system 2000 or a single coating system 2600A or 2600B. In an example, a solid layer provided by the second coating system 2600B can be different from the layer provided by the first coating system block 2600A (e.g., in composition or location being coated on the substrate).

The system 2700 can include various enclosures, such as a first enclosure 1010A for the first coating system block 2600A, and an enclosure 1010B for a second coating system block 2600B. The enclosures can each have a controlled environment as discussed in relation to other examples herein. The handler 2732 can be located within a transfer module 1400B also having a controlled environment. The internal environment of the transfer module 1400B can be commonly maintained with one or more of the first or second coating system blocks 2600A or 2600B, or maintained separately. For example, one or more gate valves or gas curtain arrangements can be used in the regions where the handler 2732 places or retrieves substrates from the first or second coating system blocks 2600A or 2600B.

The system 2700 can include one or more other modules, such as first or second modules 1100A or 1100B, which can include one or more of a pass-through or load-lock arrangement. For example, the module 1100B (e.g., an "output" module) can include a load-lock arrangement configured at least in part to transition a substrate 4000 from a first environment within the transfer module 1400B to another environment different from the environment of the transfer module 1400B (e.g., to/from a pressure at or near atmospheric pressure from/to a vacuum environment, or from/to an atmospheric environment having different controlled characteristics such as one or more of gas, moisture, particulate, or other compositions). Similarly the module 1100A (e.g., an "input module") can include a load-lock arrangement or a pass-through arrangement. Another transfer module 1400A can include a handler 1410, such as to place a substrate 4000 into the module 1100A or retrieve a substrate 4000 from the module 1100A. Other modules can be included, such as a first processing or holding module 1200A, or a second processing or holding module 1200B. Such processing or holding modules 1200A or 1200B can include a stacked arrangement of substrate 4000 locations, such as shown illustratively in the examples of FIG. 13A or FIG. 13B. Such stacked arrangements can be used for holding substrates before or after processing, or for other purposes. For example, in addition to simply holding substrates for the purpose of substrate flow management, such as holding a substrate for a period of time until another module is ready to receive it or providing a place to hold defective or damaged substrates until they can be removed, a processing or holding module can also be used to hold substrates for a period of time as a part of a functional process flow.

The first module 1100A or second module 1100B can be coupled to a vacuum source, or a purge source, or both, and can be configured for independently sealing an interface port to system 2700 and the interface port to the prior or next environment (which could be the ambient environment or a controlled environment associated with another enclosed processing module). In this manner, the first or second modules 1100A or 1100B can internally seal and transition the internal environment of the modules 1100A or 1100B between one that is not compatible with other portions of system 2700 to one that is compatible (e.g., a controlled environment at about atmospheric pressure or above atmospheric pressure that when exposed to system 2700 via the interface port would substantially maintain the quality of the controlled environment in system 2700). Similarly, the first module 1100A or second module 1100B can be used to transfer the substrate to an environment suitable for other processing (e.g., a second environment at or near atmospheric pressure but having a different composition than the controlled environment, or a vacuum environment). In this manner, the first or second modules 1100A or 1100B can provide a transfer conduit between the controlled environment of the system 2700 and other apparatus. The first module 1100A or other modules can include a permanently-attached configuration, or a cart or other transportable configuration.

In an example, a module (e.g., the first module 1100A or the second module 1100B) can then be provided with a non-reactive atmosphere or otherwise "charged" using a purified gas stream, such as including one or more purge operations, to prepare an interior region of the loading module (e.g., the first module 1100A or the second module 1100B) for exposure to interior portions of the enclosed system 2700. For example, an internal region of one or more of the modules can be at least partially evacuated or purged in order to avoid contamination in a manner exceeding the specified limits of particulate contamination level, water vapor content, oxygen content, ozone content, and organic vapor content of the controlled processing environment within an enclosed region defined by other portions of the system 2700.

Similarly, after processing by the system 2700, a substrate being processed can be placed in the first or second modules 1100A or 1100B. As an illustration, a module (e.g., the first module 1100A or the second module 1100B) can be isolated from a non-reactive gas environment elsewhere in the system 2700, such as coupled to a vacuum source to be evacuated for subsequent processing under vacuum conditions, or otherwise for transport of the substrate being fabricated to other apparatus or processing under vacuum conditions, ambient conditions, or some other static controlled environment. As a further illustration, one of the first or second modules 1100A or 1100B can be configured to provide the substrate to the controlled processing environment within the system 2700 without raising a concentration of a reactive species by more than, for example, 1000 parts per million within the enclosed region or similarly, without raising the ambient particle levels by more than a specified amount, or without depositing more than a specified number of particles of specified size per square meter of substrate area onto the substrate.

In an example, the first module 1100A can be coupled to other modules by a port (e.g., including a physical gate having a substantially gas impermeable seal) or gas curtain. When the port is opened, an interior of the first module 1100A can be accessed by a handler located in the first transfer module 1400A. The handler 1410 can include a robotic assembly having various degrees of freedom, such as to manipulate a substrate using an end effector. Such an end effector can include a fork, tray, or frame, for example, configured to support the substrate by gravity, or the end effector can securely grasp, clamp, or otherwise retain the substrate, such as to allow reorientation of the substrate from a face-up or face-down configuration to one or more other configurations. Other end effector configurations can be used, such as including pneumatic or vacuum-operated features to either actuate portions of the end effector or otherwise retain the substrate. Further illustrative examples of transfer modules including handlers are described below.

Figure 3A:
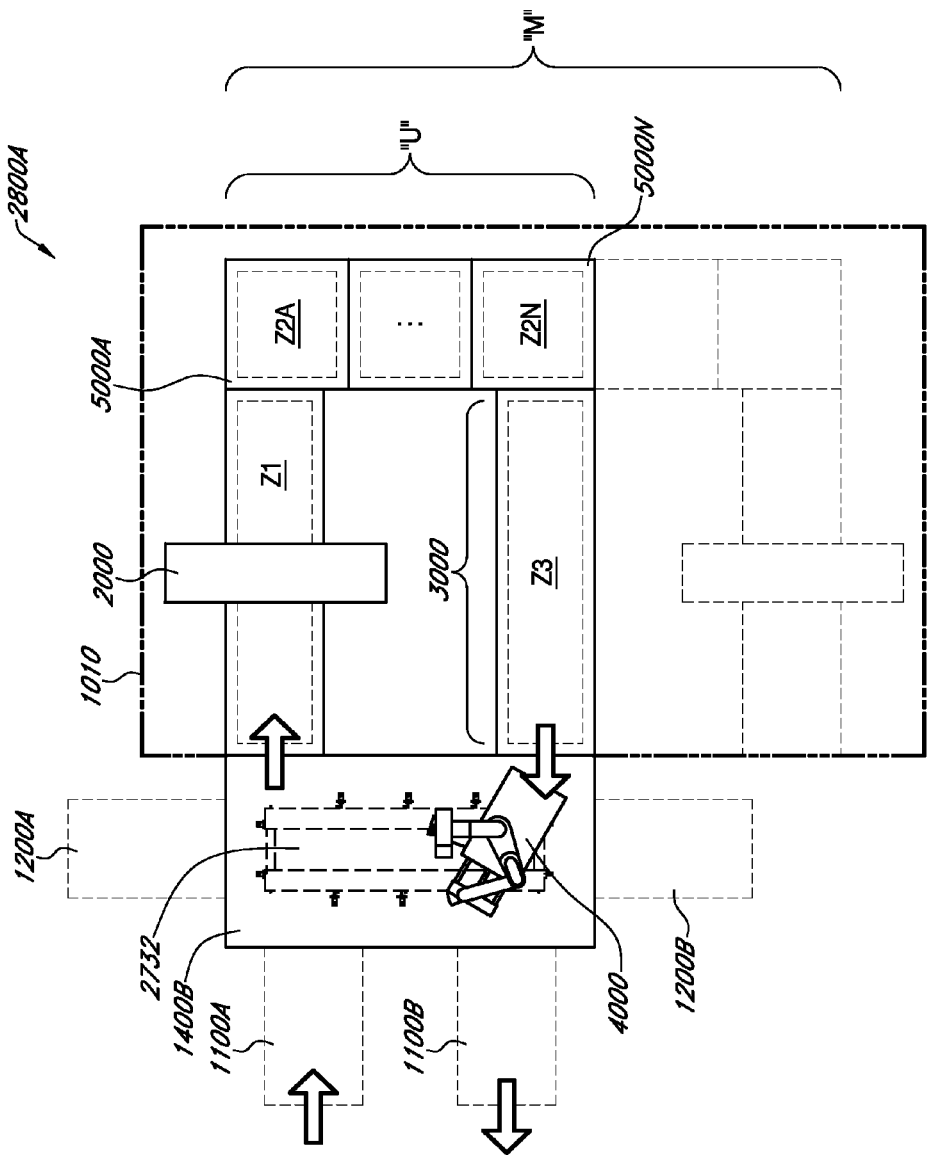
FIGS. 3A through 3D illustrate generally further examples of plan views of at least a portion of a coating system.

Other coating system configurations can be used, such as having aspects similar to the examples of FIG. 1 or FIG. 2, but having different line configurations or "topologies." For example, FIGS. 3A through 3D illustrate generally further examples of plan views of at least a portion of a coating system. FIG. 3A illustrates generally a coating system 2800A that can be referred to as a "U" configuration, such as for providing a liquid layer, and treating the liquid layer to provide a solid layer. The system 2800A can include a printing system 2000, such as having a first zone Z1 including a floatation table apparatus configured to support a substrate 4000 at least in part using a gas cushion, as in other examples. Second zones Z2A through Z2N can be used as holding or processing regions 5000A through 5000N, such as to hold a series of substrates before or after a printing operation including continuing to support the substrate at least in part using a gas cushion. A treatment system 3000 can be provided, such as having a third zone Z3.

In an in-line example, a substrate 4000 can be introduced into the system 2800A such as through a first module 1100A. The substrate can be manipulated by a handler 2732, such as located within a transfer module 1400B, and placed upon a floatation table in zone Z1 for a printing operation. The substrate 4000 can be conveyed along zone Z1 to zones Z2A through Z2N, and then to zone Z3 for a treatment operation. During traversal or operations in zone Z1, zones Z2A through Z2N, and zone Z3, the substrate 4000 can be supported at least in part using a gas cushion, such as continuously supported. Other transport techniques can be used in addition to the gas cushion arrangement, as mentioned above. Upon completion of a sequence of at least one printing and treatment operation, the substrate can be retrieved by the handler 2734 and placed in a second module 1100B, such as for further processing. If a second printing system is included, the topology of FIG. 28A can expand to form an "M" configuration. The inclusion of one or two printing systems (e.g., printing system 2000) is illustrative, and additional printing systems can be included, such as to enhance throughput, increase redundancy, or to provide additional processing operations.

Figure 3B:
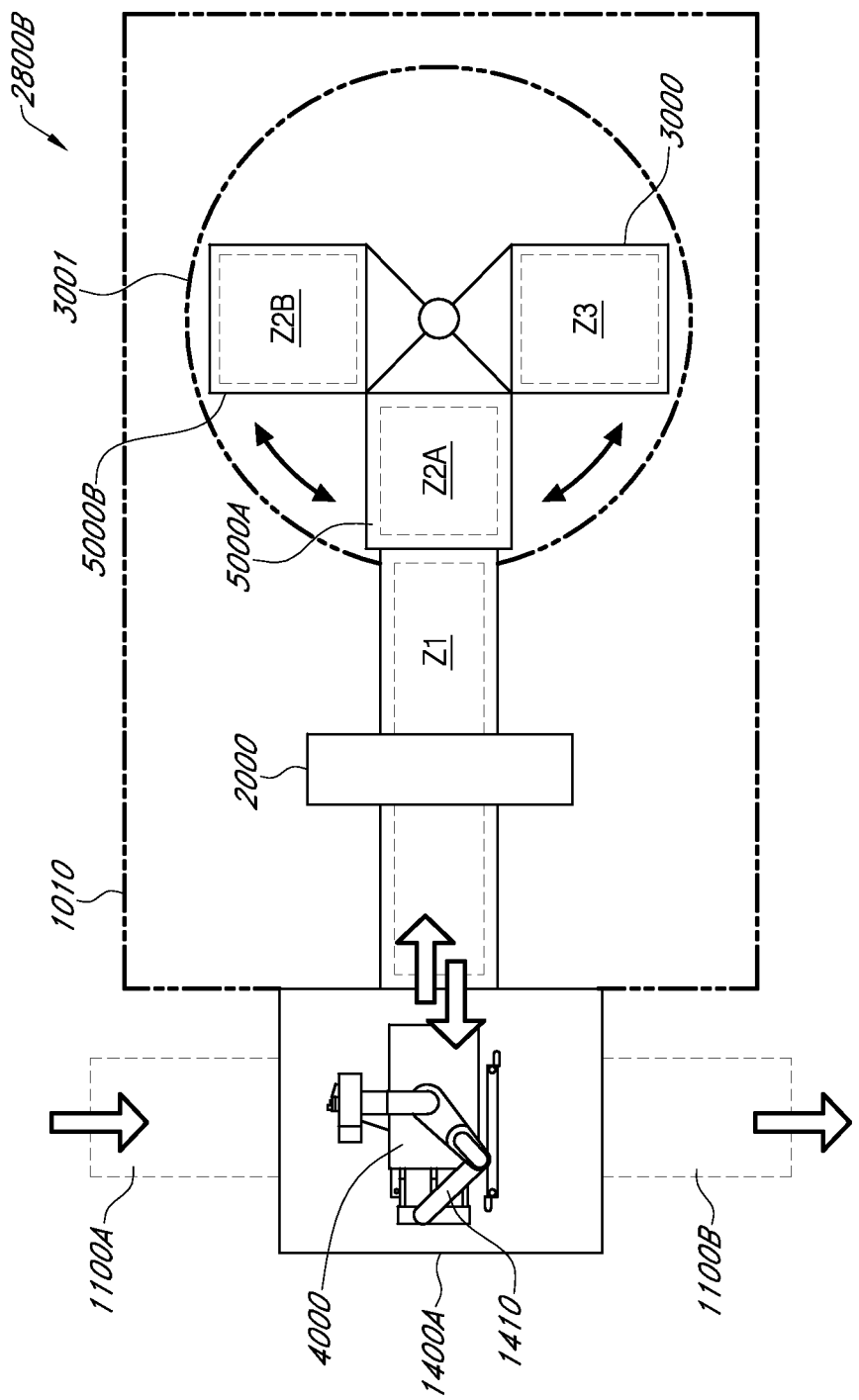

FIG. 3B illustrates generally a system 2800B that can include a "partial carousel" configuration, such as including a rotating portion 3001 (e.g., a platform, chamber, or other configuration) that can rotate to allow conveyance of a substrate to various portions of the system 2800B. As in other examples, a substrate 4000 can be introduced such as to a first module 1100A, where a handler 1410 can retrieve the substrate 4000 and place it in zone Z1 for a printing operation. The substrate 4000 can then be conveyed to one of zones Z2A or Z2B, such as for a holding operation or other processing in holding or processing regions 5000A or 5000B, including continuing to support the substrate 4000 at least in part using a gas cushion. The substrate 4000 can be conveyed back to zone Z1 and then, after rotation of the rotating portion 3001, the substrate 4000 can then be conveyed to zone Z3, such as for a treatment operation. In an example, the substrate 4000 can be conveyed directly from zone Z1 to zone Z3 without requiring holding or other processing in zones Z2A or Z2B. For example, if zones Z2A or Z2B are occupied, holding or other processing can occur in the printing zone Z1, or the treatment zone Z3. After printing and treatment, the substrate can be conveyed back to a location along zone Z1, such as for retrieval by the handler 1410. The substrate can be returned to module 1100A or placed in another module 1100B, such as for further processing. In other examples, other floatation table conveyance structures could extend radially in directions other than toward zone Z1.

Figure 3C:
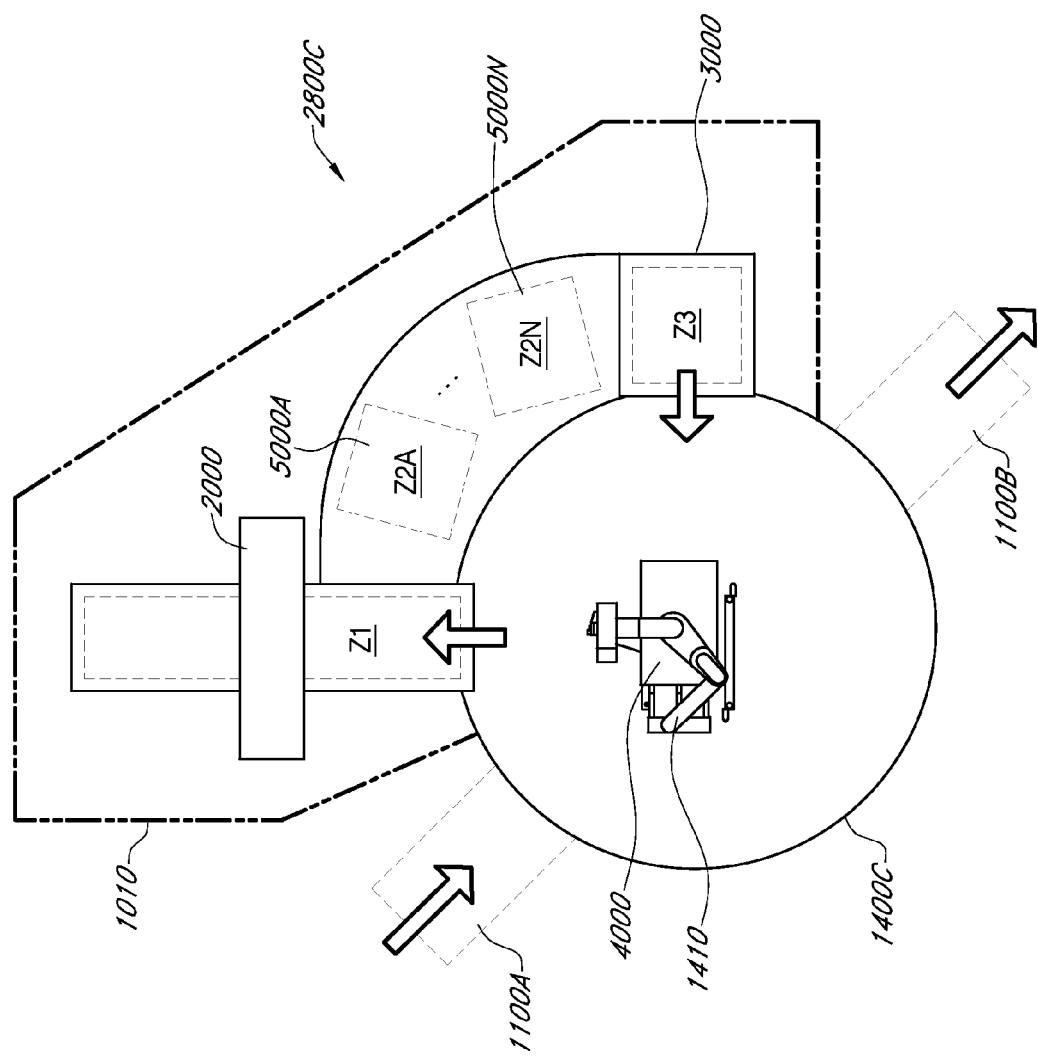

FIG. 3C illustrates generally an "arc" topology, such as can include a transfer module 1400C that connects with various portions of the system 2800C at points radially located around the transfer module 1400C. For example, a substrate 4000 can be introduced to the system 2800C such as via a first module 1100A. A handler 1410 can retrieve the substrate 4000 from the first module 1100A and place it in zone Z1, such as for a printing operation using a printing system 2000. The substrate 4000 can then be conveyed to a region 5000A in zone Z2A such as remaining stationary in zone Z2A for a specified duration, or traversing zones Z2A through Z2N including regions 5000A through 5000N over a specified duration. The substrate 4000 can be treated in a treatment region 3000, and then retrieved by the handler 1410, such as for placement back in the module 1100A or in an output module, such as the module 1100B.

Figure 3D:
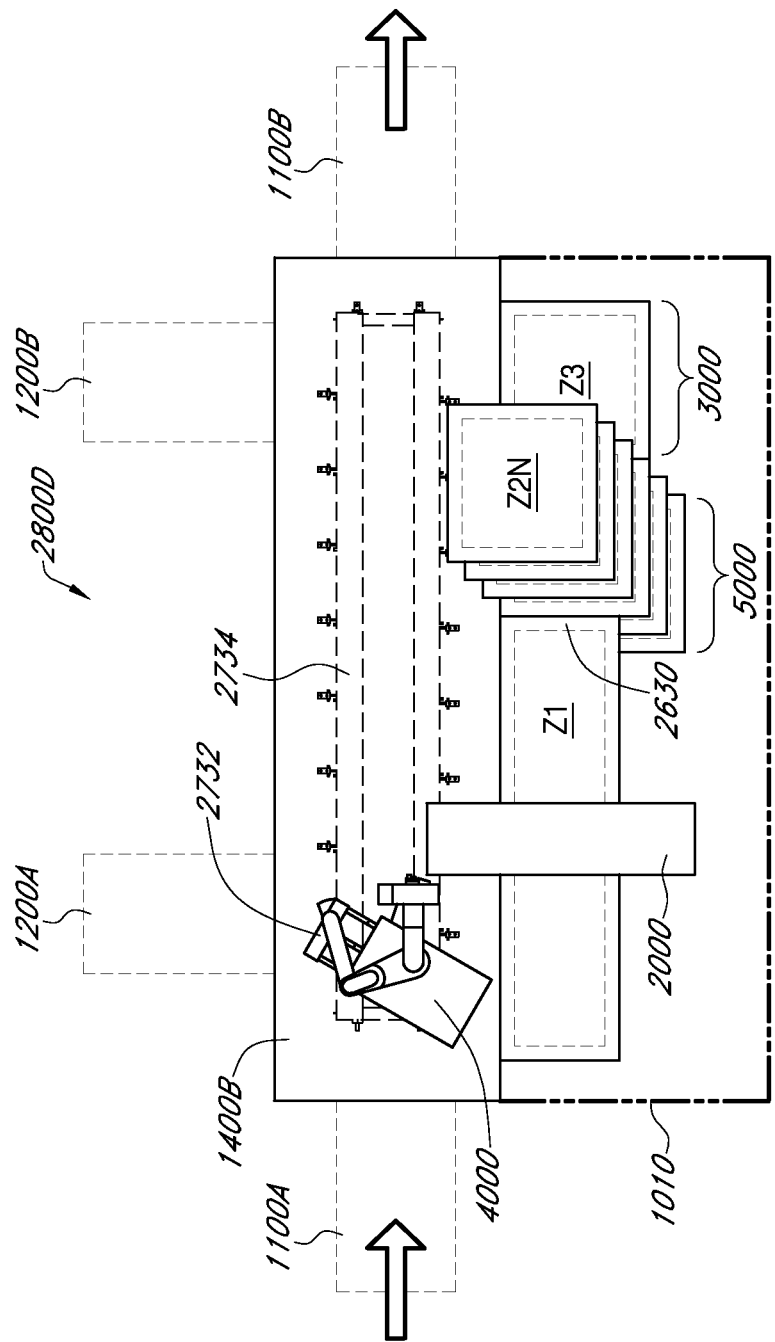

FIG. 3D illustrates generally a further example of a view of at least a portion of a system 2800D that can be used in providing a solid coating on a substrate 4000. The system 2800D can include a stacked configuration for at least a portion of the system. While the examples of FIG. 3A, FIG. 3B, and FIG. 3C generally illustrate a single substrate elevation (e.g., a substrate is conveyed laterally from operation to operation substantially in the plane of the substrate itself), such examples can be combined with other examples described herein, such as including one or more portions having a stacked configuration. The system 2800D can include a module 1100A, such as input module, such as coupled to a transfer module 1400B. The transfer module 1400B can include a handler 2732, such as can traverse a track 2734 to access other portions of the system 2800D. The transfer module 1400B can be coupled to other portions of the system 2800, such as a module 1100B (e.g., an output module), or one or more other modules such as a holding or processing module 1200A or a holding or processing module 1200B.

The handler 2732 can provide a substrate to a first zone Z1 nearby a printing system 2000, such as for deposition (e.g., printing) of a liquid ink layer on the substrate 4000. The substrate 4000 can then be conveyed via a floatation stage conveyance system 2630 to a specified one of a stacked array of zones Z2A through Z2N in a region 5000. Such zones Z2A through Z2N can be lowered or raised, for example, so that the specified one of the stacked array is aligned laterally in substantially the same plane of the printing zone Z1 for conveyance of the substrate. After holding for a specified duration or undergoing other processing in the region 5000, or until availability of zone Z3, such as included as a portion of a treatment system 3000, the specified one of the zones Z2A through Z2N can be aligned with zone Z3, and the substrate can be conveyed via floatation to zone Z3. In the example of FIG. 3D, the zone Z3 is shown as having about the same elevation as Z1, but this need not be the case. For example, the treatment zone Z3 can be at a different elevation than the zones Z2A through Z2N, or the printing zone Z1.

As in the other examples above, during operations such as printing or treatment within the system 2800D, the substrate 4000 can be supported at least in part on a gas cushion throughout a sequence of process, such as reducing one or more of handling steps or mechanical contact between the substrate 4000 and the processing apparatus. Without being bound by theory, it is believed that such reduction of handling steps involving the handler 2732 or reduction of mechanical contact can enhance a coating layer uniformity, such as by helping to suppress formation or circulation of particulate contaminants or by helping to suppress non-uniformities across the substrate due to a thermal or electrostatic non-uniformities.

Figure 4A:
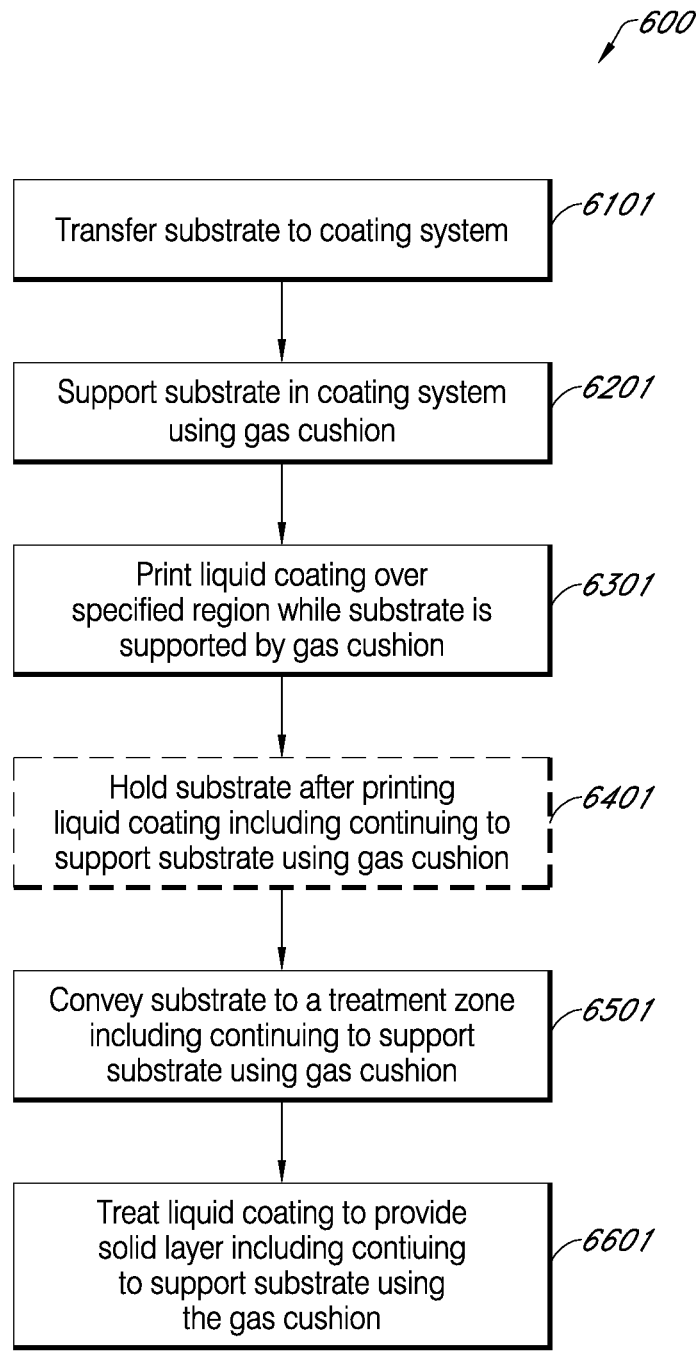
FIG. 4A illustrates generally a technique, such as a method, that can include forming patterned solid layer on a substrate, such as can include using the systems shown in the examples of FIG. 1, 2, or 3A through 3D.

FIG. 4A illustrates generally a technique 6001, such as a method, that can include forming a coating on a substrate, such as can include using the systems shown in the examples of FIG. 1, 2, or 3A through 3D. During certain operations, such as during one or more of printing, holding, or treatment, a substrate can be supported by a floatation apparatus using a pressurized gas or a combination of pressurized gas and vacuum. At 6101, a substrate can be transferred to a coating system. For example, the substrate can be processed elsewhere such as having one or more layers fabricated upon the substrate. As mentioned above, the substrate can include layers that are patterned or blanket coated over the substrate, and such layers can coat or can be included as part of a light emitting device (e.g., a display or lighting panel), a light absorbing device (e.g., photodetector or solar cell), a printed circuit assembly, or other electronic device or circuit.

At 6201, the substrate can be supported in the coating system, such as at least in part using a gas cushion provided to side of the substrate opposite the region where the patterned solid layer is to be formed, such as including continuing to support the substrate at least in part using the gas cushion. At 6301, a liquid coating can be deposited on the substrate, such as using a printing technique. Broadly, the printing operation can include one or more liquid coating processes, such as inkjet printing, nozzle printing, slot die coating (patterned or un-patterned), or screen printing, and the liquid ink can comprise one or more of an organic material (e.g., a monomer or a polymer) or an inorganic material, and can include a carrier fluid.

Optionally, at 6401, the substrate can be held, such as in a region or zone arranged for such holding (e.g., a zone located along or included as a part of a floatation table arrangement). Such holding can occur for a specified fixed duration or can be specified to include sufficient duration to permit the substrate to transition or evolve from one state to another different state. Such holding can also be established at least in part by a latency or availability of other processing areas, such as a treatment area. During the holding operation, the substrate can continue to be supported at least in part by a gas cushion. At 6501, the substrate can be conveyed to a treatment zone, including continuing to support the substrate at least in part using the gas cushion. In an example, the conveyance at 6501 can occur before the optional holding mentioned at 6401. In another example, the optional holding mentioned at 6401 can occur while the substrate is still located in the printing zone.

Figure 4B:
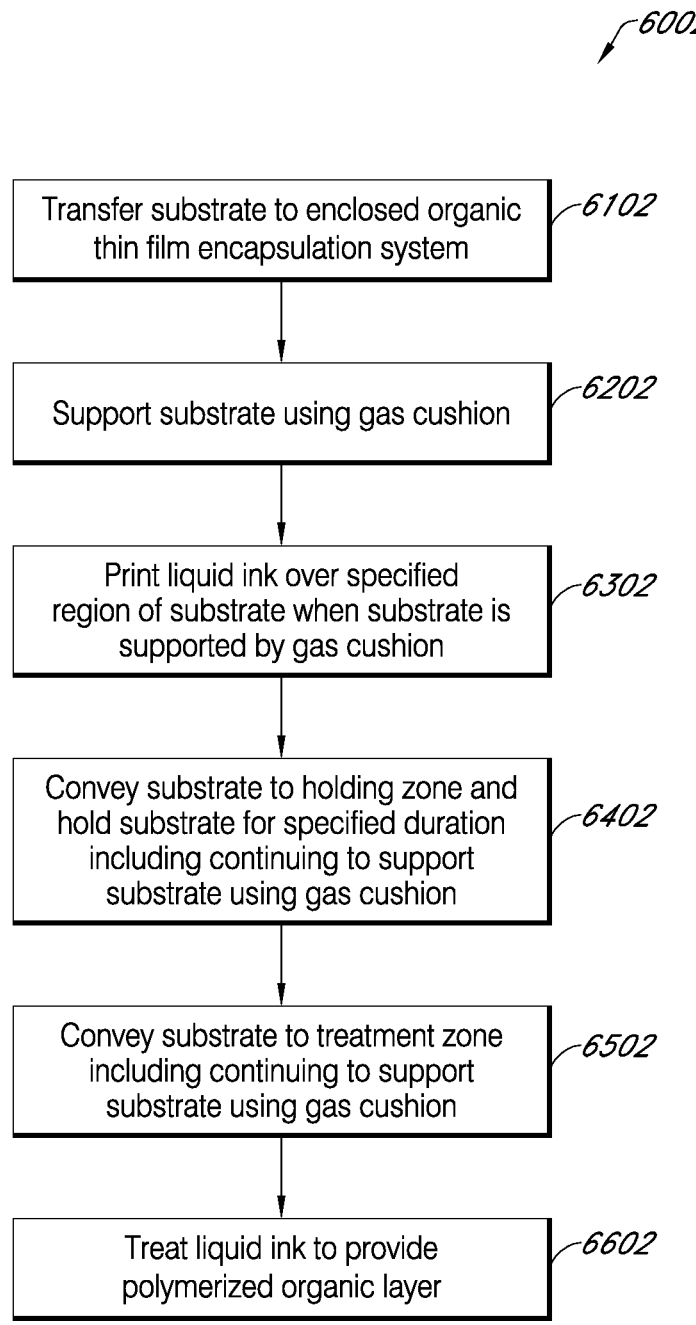
FIG. 4B illustrates generally a technique, such as a method, that can include forming an organic encapsulation layer (OEL), such as can include using the systems shown in the examples of FIG. 1, 2, or 3A through 3D.

At 6601, the liquid coating provided at 6301 can be treated. Treatment of the liquid ink can include one or more of light exposure (e.g., including one or more of ultraviolet, infra-red, or visible light), heating or cooling, higher-than-ambient pressure or vacuum. Such treatment can result in solidification of liquid ink to provide the solid layer through one or more of removal of a carrier fluid (e.g., one or more of drying or baking, such as including vacuum drying or vacuum baking), chemical reaction (e.g., cross linking or chemical transformation from one compound to another), or densification (e.g., baking, such as including vacuum baking). In the example of FIG. 4B, such treatment includes exposure to ultraviolet light, such as to provide a patterned solid layer corresponding to the region or regions where the liquid ink was deposited.

Portions of an electronic device, such as a light emitting or light absorbing device, can be encapsulated using one or more film layers deposited upon a device being fabricated upon a substrate. In an example, such film layers can include a stack or other configuration of layers comprising inorganic and organic materials. FIG. 4B illustrates generally a technique 6002, such as a method, that can include forming an organic encapsulation layer (OEL), such as can include using one or more aspects of the coating systems shown in the examples of FIG. 1, 2, or 3A through 3D. Such an OEL can be included as a portion of an encapsulation structure.

At 6102, a substrate can be transferred to an enclosed organic thin film encapsulation system configured to deposit a layer (e.g., a patterned organic layer) in a specified region on a first side of the substrate, the organic layer coating at least a portion of a device fabricated upon the substrate. At 6202, the substrate can be supported in the enclosed thin film encapsulation system at least in part using a gas cushion provided to a second side of the substrate opposite the specified region. At 6302, a liquid ink, which can be in an example an organic monomer-based ink, can be printed (e.g., inkjet printed) over the specified region of the substrate with the substrate located in a printing zone including the printing system while the substrate is supported at least in part by the gas cushion. At 6402, the substrate can be conveyed to a holding zone and the substrate can be held for a specified duration including continuing to support the substrate at least in part using the gas cushion. At 6502 the substrate can be conveyed to a treatment zone, including continuing to support the substrate at least in part using the gas cushion. As mentioned in relation other examples, conveyance of the substrate to the treatment zone can occur before or after holding, and the holding operation need not be performed in a holding zone. For example, such holding can be performed instead or in addition in one or more of the printing zone or the treatment zone.

At 6602, the substrate can be treated, including treating the liquid ink, which can be in an example an organic monomer-based ink, to provide a polymerized organic layer upon the substrate in the specified region, the treatment occurring while the substrate is continuing to be supported at least in part using the gas cushion. The patterned organic layer can include a portion of an encapsulation structure, the structure established to encapsulate at least a portion of light-emitting devices on the substrate.

Figure 5:
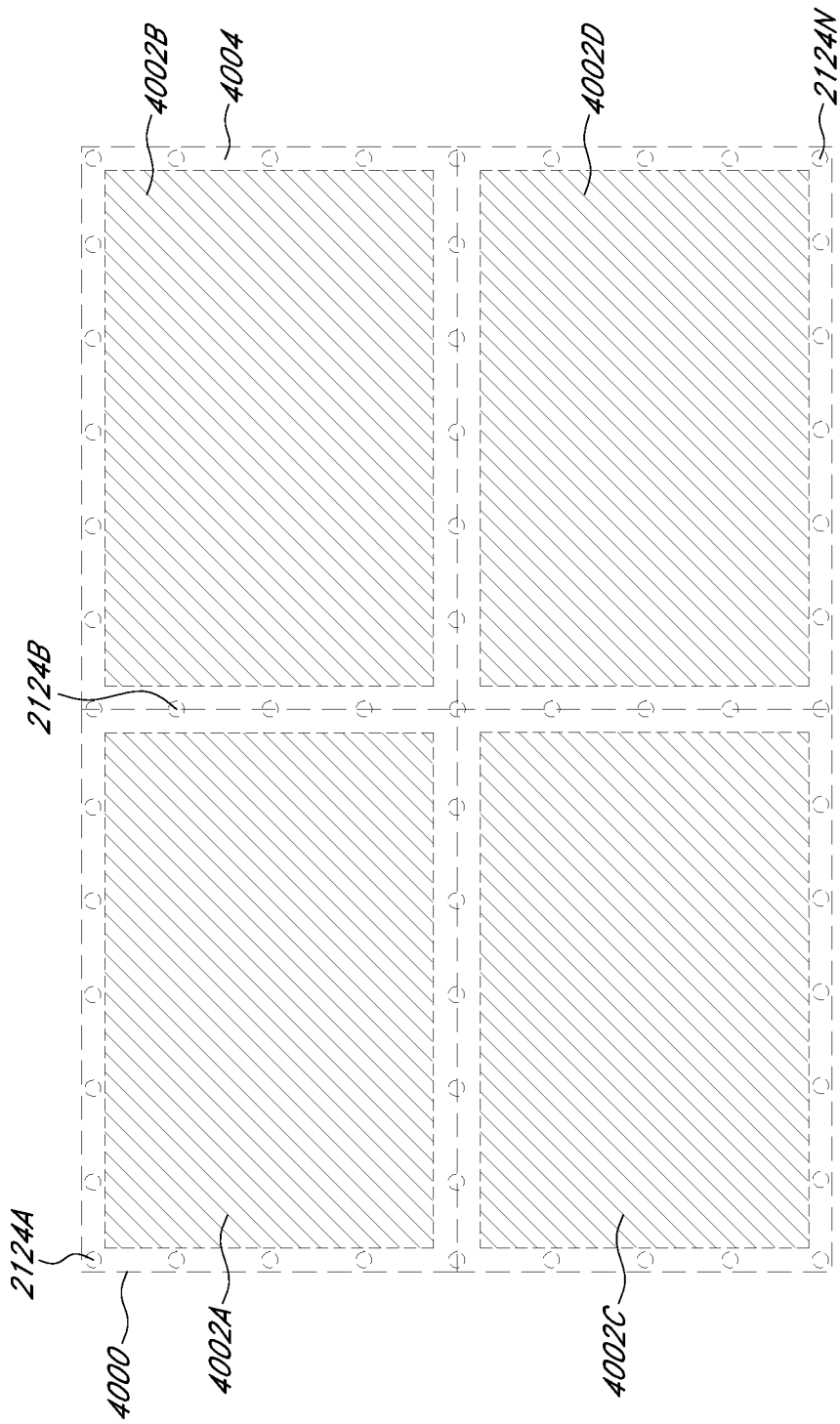
FIG. 5 illustrates generally an example depicting various regions of a substrate.

FIG. 5 illustrates generally an example depicting various regions of a substrate 4000 such as can be supported at least in part using pressurized gas ports or pressurized gas regions, or a combination of such pressurized gas along with vacuum ports or vacuum regions. A substrate 4000 can include a glass material or one or more other materials. In the illustrative example of flat panel displays, the substrate 4000 can include either a single large display or two or more smaller displays that can be singulated from the substrate 4000. In the illustrative example of FIG. 5, four display regions 4002A, 4002B, 4002C, and 4002D are shown. These can be referred to as "active" regions or "emitting regions," for example. Use of the term "active" in this example does not somehow imply that such regions are actually optically emissive during processing, but instead refers to regions that can include devices configured to emit light or regions that otherwise form an emissive or transmissive portion of a display that is visible to an end user. Generally, visible defects in the regions 4002A through 4002D will be deemed unacceptable by end users, and accordingly various techniques can be used such as to enhance a visible uniformity of the regions 4002A through 4002D. Other variations in panel configuration of the substrate 4000 are possible. For example, a substrate 4000 can include a single display or array of OLED devices. In other examples, the substrate 4000 can be divided up into two, four, or eight regions, such as establishing corresponding perimeters for support, or such as having corresponding distributed porous media regions as mentioned in other examples herein. For other manufacturing examples in which other devices, such as optical, electrical, or optoelectronic devices, are on the substrate and being coated, such as being coated with an organic encapsulation layer, the definition of "active" can be adjusted to suitably encompass the regions corresponding to those devices. Examples of such devices can include electronic circuits, solar cells, printed circuit boards, and flat panel displays.

In an example, support can be provided during processing such as using a pressurized gas cushion established on a surface underneath the substrate in the display regions 4002A through 4002D. Region 4004 extending around the periphery of the substrate 4000 and extending into the interior spaces between each of the display regions 4002A through 4002D can be engaged by physical contact between the substrate and fixtures, such as can include on or more of grippers, rollers, lift pins, or other fixtures. Such a region 4004 can be referred to as a "keep out" area, indicating that emitting or active elements of the display (or other elements as mentioned above in relation to other types of devices other than displays) can be kept clear of such engagement regions (or vice versa). For example, one or more "lift pins" can be located in an area as shown illustratively in FIG. 5, such as in a first region 2124A, a second region 2124B (e.g., in a location between display regions 4002A and 4002B), and an "Nth" region 2124N. Such lift pins can provide increased clearance between the substrate 4000 and one or more ports or distributed pressurized gas sources, such as can be used to support the substrate in the regions 4002A, 4002B, 4002C, or 4002D.

A floatation platform or chuck can include a continuous array of small pressure apertures, or a continuous porous plate, such as providing a flow of pressurized gas on which the substrate can float. Holes can still be provided in the chuck surface, such as 2124A and 2124B, for example, for lift pins (which when retracted sit below the chuck surface), but because the substrate floats above the chuck surface, the presence of "mura" or non-uniformity in the coating over such holes can be reduced or eliminated. In this way, even the interior regions in between regions 4002A through 4002D may be utilized as active regions, improve productivity and enabling the manufacture of a larger continuous active device. As in yet other examples, a combination of pressurized gas ports and vacuum ports can be used, such as shown and described elsewhere. For example, the substrate 4000 can be retained such as by one or more vacuum ports (e.g., circular ports, or slots, for example) such as in the regions 2124A through 2124N as shown in region 4004.

As mentioned above, such a region 4004 can again include a periphery of a substrate 4000. In an illustrative example, physical contact between the substrate 4000 and any fixtures can generally be restricted to such a periphery region 4004 during certain processing operations, such as during one or more of deposition (e.g., printing of a material on substrate 4000), holding, treatment, or other processing. Such a region 4004 can, for example, extend inward from the edges of the substrate by 100 millimeters or 200 millimeters. Elsewhere, the substrate can be supported at least in part in the region 4002 using one or more pressurized gas ports. Such a combination of vacuum ports and pressurized gas ports can avoid imparting undue stress on a large substrate 4000 because the substrate can be supported physically in the periphery region 4004, and supported at least in part by pressurized gas in the central region 4002. In this manner, it does not matter whether the substrate 4000 includes a single large display being fabricated, or several smaller displays. Therefore, a common conveyor or floatation table configuration can be used for a variety of different display configurations because contact can be restricted to a peripheral region 4004 of the substrate 4000 while supporting the substrate 4000 (e.g., centrally) with pressurized gas.

In processing where the substrate 4000 can be supported exclusively by the gas cushion, a combination of positive gas pressure and vacuum can be applied through the arrangement of ports or distributed regions. Such a zone having both pressure and vacuum control can effectively provide a fluidic spring between a floatation table or platform and the substrate 4000. A combination of positive pressure and vacuum control can provide a fluidic spring with bidirectional stiffness. The gap that exists between the substrate (e.g., substrate 4000) and a surface can be referred to as the "fly height," and such a height can be controlled or otherwise established by controlling the positive pressure and vacuum port states. In this manner, the substrate orientation can be carefully controlled such as for one or more of printing, holding, treatment, or other processing.

Elsewhere, such as where the fly height need not be controlled precisely, pressure-only floatation zones can be provided, such as along a conveyor or elsewhere. A "transition" zone can be provided such as where a ratio of pressure to vacuum nozzles or area increases or decreases gradually, such as along a conveyor or table. In an illustrative example, there can be an essentially uniform height between a pressure-vacuum zone, a transition zone, and a pressure only zone, so that within tolerances, the three zones can lie essentially in one plane. A fly height of a substrate 4000 over pressure-only zones elsewhere can be greater than the fly height of a substrate 4000 over a pressure-vacuum zone, such as in order to allow enough height so that a substrate will not collide with a floatation table in the pressure-only zones.

In an illustrative example, a substrate can have a fly height of between about 150 micrometers ($\mu$) to about 300$\mu$ above pressure-only zones, and then between about 10$\mu$ to about 50$\mu$ above a pressure-vacuum zone. In an illustrative example, one or more portions of a floatation platform or table can include an "air bearing" assembly provided by NewWay® Air Bearings (Aston, Pa., United States of America) or Coreflow (Israel). While the examples of gas pressurized support of a substrate are discussed in relation to FIG. 5, such techniques can be used in addition to or instead of other conveyance or support approaches.

Figure 6:
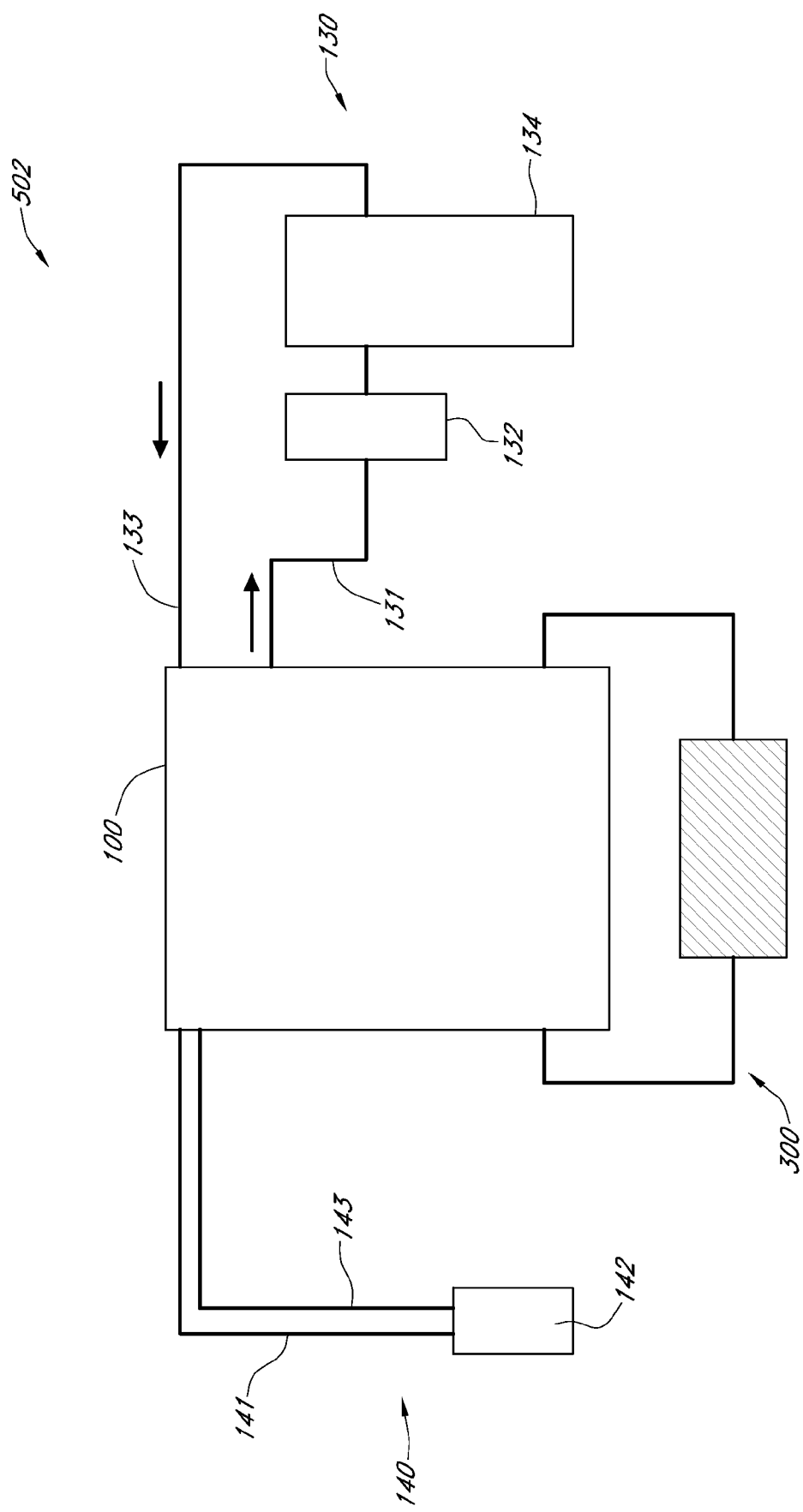
FIG. 6 illustrates generally a schematic representation of a gas purification scheme that can be used in relation to portions or entireties of one or more other examples described herein, such as to establish or maintain an controlled environment in an enclosure.

FIG. 6 illustrates generally a schematic representation of a gas purification scheme that can be used in relation to portions or entireties of one or more other examples described herein, such as to establish or maintain an controlled environment in an enclosure. For example, a gas enclosure system 502 can include a gas enclosure assembly 100 (e.g., an enclosure having a controlled environment), a gas purification loop 130 in fluid communication with the gas enclosure assembly 100, and a thermal regulation system 140 (e.g., as can be referred to as a temperature controller in other examples herein).

The system 502 can include a pressurized gas recirculation system 300, which can supply gas for operating various devices, such as a substrate flotation table or other pressurized-gas devices, such as for the various coating system examples described herein. The pressurized gas recirculation system 300 can include or use a compressor, a blower, or both. Additionally, the gas enclosure system 502 can have a circulation and filtration system internal to gas enclosure system 502 (e.g., one or more fan filter units (FFUs) as described in other examples herein).

One or more ducts or baffles can separate non-reactive gas circulated through the gas purification loop 130 from the non-reactive gas that is otherwise filtered and circulated internally for various embodiments of a gas enclosure assembly. For example, the gas purification loop 130 can include an outlet line 131 from the gas enclosure assembly 100. A solvent removal component 132 can be provided, for solvent abatement, and gas to be purified can be routed from the solvent removal component 132 to a gas purification system 134. Gas purified of solvent and other reactive gas species, such as one or more of ozone, oxygen, and water vapor, can be circulated back to the gas enclosure assembly 100, such as through an inlet line 133.

The gas purification loop 130 can include appropriate conduits and connections such as to interface with monitoring or control devices. For example, ozone, oxygen, water vapor, or solvent vapor sensors can be included. A gas circulating unit, such as a fan, blower, or other arrangement, can be separately provided or integrated, for example, in gas purification system 134, such as to circulate gas through the gas purification loop 130. In the illustration of FIG. 6, the solvent removal component 132 and gas purification system 134 are shown as separate units. However, the solvent removal component 132 and gas purification system 134 can be housed together as a single unit.

The gas purification loop 130 of FIG. 6 can have solvent removal component 132 placed upstream of gas purification system 134, so that gas circulated from gas enclosure assembly 100 can pass through solvent removal component 132, such as via an outlet line 131. In an example, the solvent removal component 132 can include a solvent trapping system based on adsorbing solvent vapor from a gas passing through the solvent removal component 132. For example, a bed or beds of a sorbent, such as activated charcoal, molecular sieves, or the like, can effectively remove a wide variety of organic solvent vapors. In another example, a cold trap technology can be used to remove solvent vapors as a portion of the solvent removal component 132. Sensors, such as ozone, oxygen, water vapor and solvent vapor sensors, can be used to monitor the removal of such species from gas continuously circulating through a gas enclosure system, such as gas enclosure system 502. For example, information obtained from such sensors or other devices can indicate when sorbent, such as activated carbon, molecular sieves, or the like, have reached capacity or have otherwise become less effective, so that the bed or beds of sorbent can be regenerated or replaced, for example.

Regeneration of a molecular sieve can involve heating the molecular sieve, contacting the molecular sieve with a forming gas, a combination thereof, or the like. For example, molecular sieves configured to trap various species, including ozone, oxygen, water vapor, or solvents, can be regenerated by heating and exposure to a forming gas. In an illustrative example, such a forming gas can include hydrogen, for example, a forming gas comprising about 96% nitrogen and about 4% hydrogen, with said percentages being by volume or by weight. Physical regeneration of activated charcoal can be done using a procedure of heating under a controlled environment.

A portion of the gas purification system 134 of the gas purification loop 130 can include systems available, for example, from MBRAUN Inc., of Statham, N.H., or Innovative Technology of Amesbury, Mass. The gas purification system 134 can be used to purify one or more gases in gas enclosure system 502, for example, to purify the entire gas atmosphere within a gas enclosure assembly. As mention above, in order to circulate gas through gas purification loop 130, the gas purification system 134 can have a gas circulating unit, such as a fan or blower, for example. A gas purification system can be selected or configured depending on the volume of the enclosure, which can define a volumetric flow rate for moving a non-reactive gas through a gas purification system. In an illustrative example, a gas enclosure system having a gas enclosure assembly can include a volume of about 4 cubic meters and a gas purification system that can move about 84 cubic meters per hour can be used. In another illustrative example, a gas enclosure system having a gas enclosure assembly can include a volume of about 10 cubic meters and a gas purification system that can move about 155 cubic meters per hour can be used. In yet another illustrative example, a gas enclosure assembly having a volume of between about 52 to about 114 cubic meters, more than one gas purification system can be used.

Gas filters, dryers, or other purifying devices can be included in the gas purification system 134. For example, a gas purification system 134 can include two or more purifying devices, such as in a parallel configuration or otherwise arranged such that one of the devices can be taken off line for maintenance and one or more other devices can be used to continue system operation without interruption. For example, the gas purification system 134 can comprise one or more molecular sieves, such as at least a first molecular sieve and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously mentioned, molecular sieves can be regenerated and reused.

The thermal regulation system 140 of FIG. 6 can include at least one chiller 142, which can have a fluid outlet line 141 for circulating a coolant into a gas enclosure assembly, and fluid inlet line 143 for returning the coolant to the chiller. An at least one fluid chiller 142 can be provided for cooling the gas atmosphere within gas enclosure system 502. For example, the fluid chiller 142 can deliver cooled fluid to heat exchangers within the enclosure, where gas can be passed over a filtration system internal the enclosure. At least one fluid chiller can also be provided with gas enclosure system 502 to cool heat evolving from an apparatus enclosed within gas enclosure system 502. In an illustrative example, a fluid chiller can also be provided for gas enclosure system 502 to cool heat evolving from a coating system. A thermal regulation system 140 can include heat-exchange or Peltier devices and can have various cooling capacities. For example, a chiller can provide a cooling capacity of from between about 2 kilowatts (kW) to about 20 kW of capacity. According to various examples, the gas enclosure system 502 can have a plurality of fluid chillers that can chill one or more fluids. A fluid chiller can use various fluids as a heat transfer medium, for example, such as water, anti-freeze, a refrigerant, or combination thereof. Leak-free, locking connections can be used in connecting the associated conduits and system components.

While the examples above mentioning cooling capacities and chilling applications, the examples above can also be applied to applications where including buffering of substrates in a controlled environment, or for applications where circulating gas can be maintained at a temperature similar to other portions of the system, such as to avoid unwanted heat transfer from substrates being fabricated or to avoid disruption of temperature uniformity across a substrate or between substrates.

Figure 7:
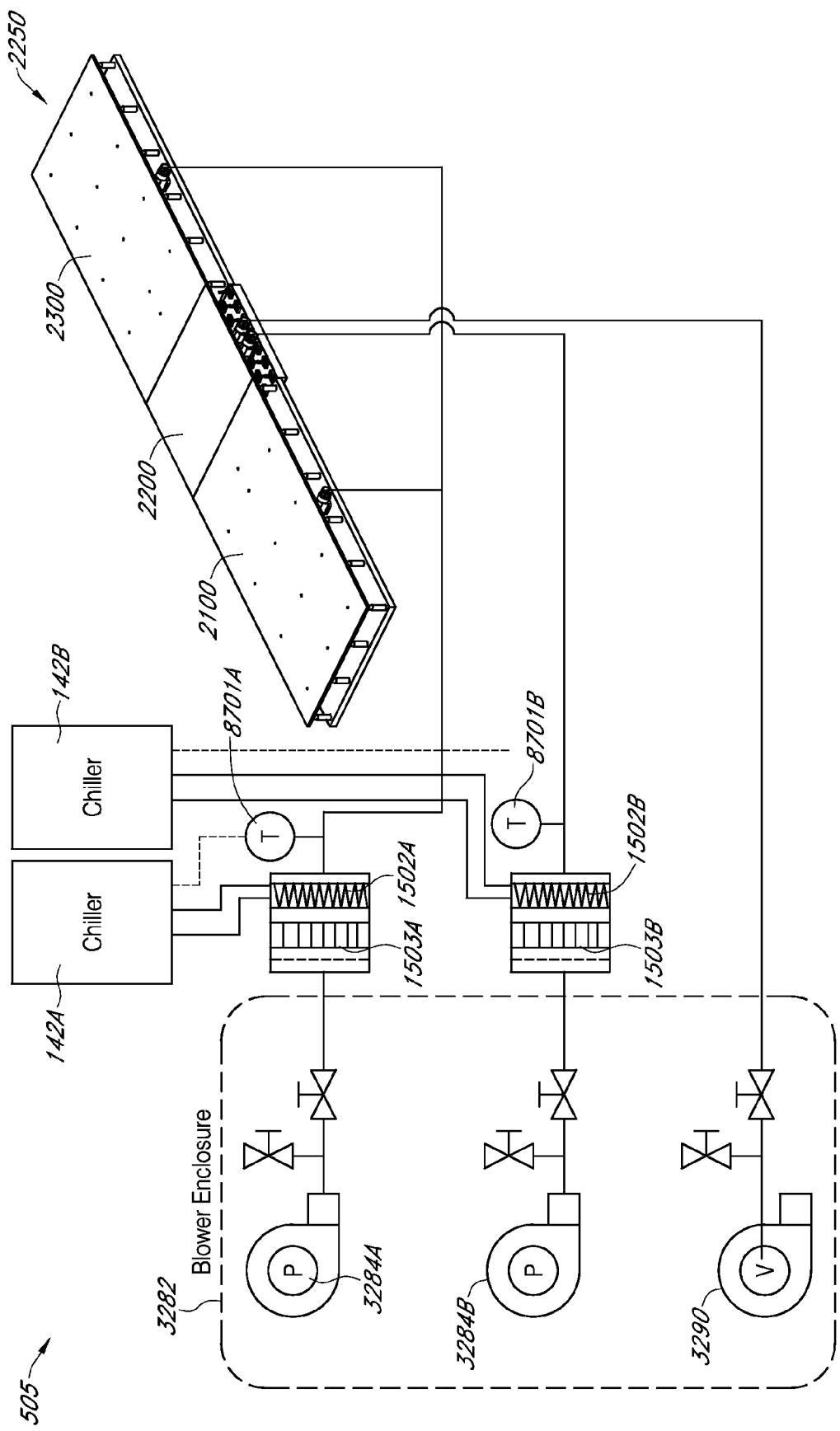
FIG. 7 illustrates generally an example of at least a portion of a system for integrating and controlling one or more gas or air sources, such as to establish floatation control zones included as a portion of a floatation conveyance system.

FIG. 7 illustrates generally an example of at least a portion of a system 505 for integrating and controlling one or more gas or air sources, such as to establish floatation control zones included as a portion of a floatation-based support or conveyance system. Such a system 505 can include a table 2250 such as having various regions configured to support a substrate by establishing a gas cushion. In this illustrative example, regions 2100, 2200, and 2300 can be referred to as input, printing, and output for illustration only. Such regions can be used for other processing steps, such as conveyance of a substrate, or support of a substrate such as during one or more of holding, drying, baking, or other treatment, or other processing of the substrate according to other examples. In the illustration of FIG. 7, a first blower 3284A is configured to provide pressurized gas in one or more of the input or output regions 2100 or 2300 of a floatation table apparatus. Such pressurized gas can be temperature controlled such as using a first chiller 142A coupled to a first heat exchanger 1502A. Such pressurized gas can be filtered using a first filter 1503A. A temperature monitor 8701A can be coupled to the first chiller 142 (or other temperature controller).

Similarly, a second blower 3284B can be coupled to the printing region 2200 of the floatation table. A separate chiller 142B can be coupled to a loop including a second heat exchanger 1502B and a second filter 1503B. A second temperature monitor 8701B can be used to provide independent regulation of the temperature of pressurized gas provided by the second blower 3284B. In this illustrative example, the input and output regions 2100 and 2300 are supplied with positive pressure, but the printing region 2200 can include use of a combination of positive pressure and vacuum control to provide precise control over the substrate position. For example, using such a combination of positive pressure and vacuum control, the substrate can be exclusively controlled using the floating gas cushion provided by the system 504 in the zone defined by the printing region 2200. The vacuum can be established by a third blower 3290, such as also provided at least a portion of the make-up gas for the first and second blowers 3284A or 3284B within the blower housing 3282.

Figure 8A:
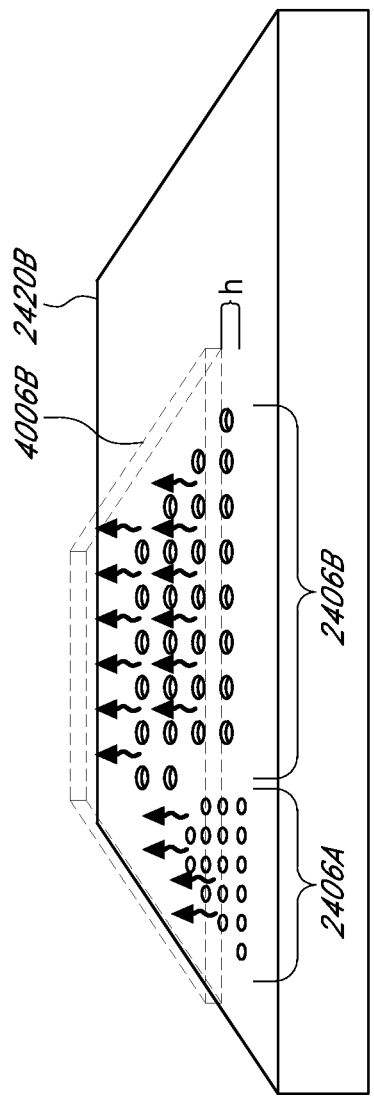
FIG. 8A and FIG. 8B include illustrative examples of a chuck configuration that can establish a pressurized gas cushion to support a substrate, such as during one or more of a deposition (e.g., printing), holding, or treatment process, and a corresponding uniformity in a resulting processed substrate in FIG. 8C.
Figure 8B:
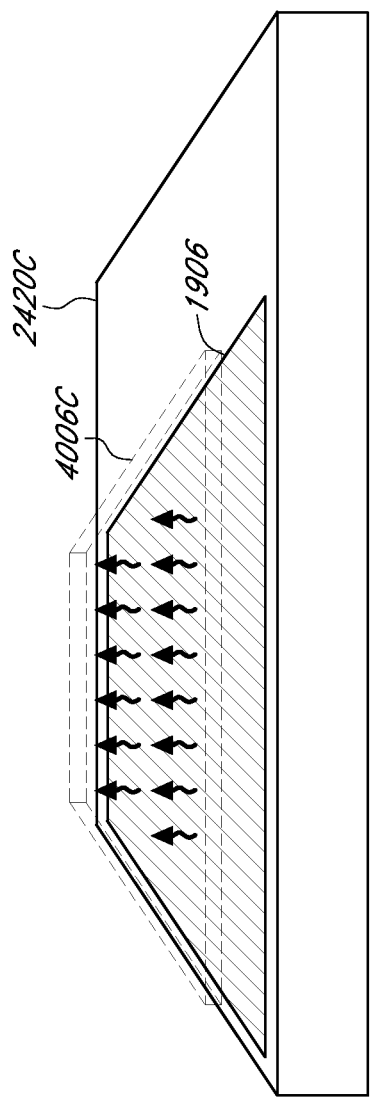
Figure 8C:
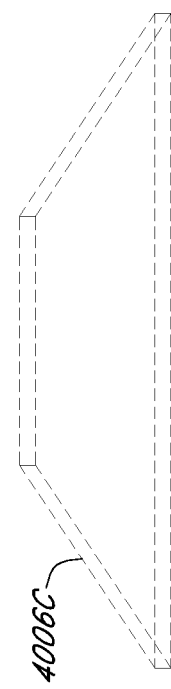

FIG. 8A and FIG. 8B include illustrative examples of a chuck or table configuration that can establish a pressurized gas cushion to support a substrate, such as during one or more of a deposition (e.g., printing), holding, or treatment process, and a corresponding uniformity in a resulting processed substrate 4006C in FIG. 8C. FIG. 8A illustrates generally an example of a chuck 2420B configuration that includes ports configured to establish a pressurized gas cushion to support a substrate 4006B, such as during one or more of a deposition, a holding operation, a material dispersing or flowing operation, or treatment process. In this approach, because the substrate 4006B is not required to contact thermally-non-uniform features of the chuck 2420B during various processes, a substrate 4006B can avoid large and highly-visible mura. Different port configurations can be used, such as having a first port density in the region 2406A, and a second port density in the region 2406B.

As mentioned in other examples herein, a fly height, "h" can be established such as by using a combination of vacuum and pressurized gas ports, such as in the arrays of the regions 2406A and 2406B. For example, in each row of ports, the ports can alternate between being assigned as a vacuum port or a pressurized gas port. In this manner, precise control of the height, h, can be established and the substrate 4006B can be stabilized in the z-dimension with respect to the chuck surface. As in other examples herein, a combination of mechanical anchoring and pressurized gas can also be used. For example, lateral motion of the substrate 4006B (e.g., in a direction parallel a surface of the chuck) can be limited, such as by using one or more lateral stops or bumpers, and conveyance of the substrate 4006B can be facilitated using one or more rollers or grippers, such as engaging the substrate at a periphery.

FIG. 8B illustrates generally examples of a chuck configuration that includes a porous medium 1906, such as to establish a distributed pressure during one or more of deposition, holding, treatment, or other processing, such as providing uniformity in the resulting substrate 4006C as shown in FIG. 8C. As mentioned in relation to other examples herein, a porous medium 1906 "plate" such as coupled to or included as a portion of a chuck 2420C or floatation platform can provide a "distributed" pressurized gas cushion to support the substrate 4006C, such as without using large apertures as shown in FIG. 8A, and providing a substrate 4006C as shown in FIG. 8C having reduced or minimize the formation of mura or other visible defects. As mentioned in relation to other examples herein, a porous medium 1906 "plate" such as coupled to or included as a portion of a chuck 2420C can provide a "distributed" pressure to uniformly float the substrate 4006C during processing, such as without using individual apertures as shown in FIG. 8A.

A porous medium 1906 or similar distributed pressure or vacuum regions as mentioned elsewhere herein, can be obtained such as from Nano TEM Co., Ltd. (Niigata, Japan), such as having physical dimensions specified to occupy an entirety of the substrate 4006C, or specified regions of the substrate such as display regions or regions outside display regions. Such a porous medium can include a pore size specified to provide a lifting force over a specified area, while reducing or eliminating mura or other visible defect formation such as during holding, treatment, or other processing. Without being bound by theory it is believed that use of a porous medium can enhance uniformity of a coating or film layer on the substrate 4006C, such as by reducing or minimizing mura or other visible defects associated with non-uniform thermal profile or electrostatic field profile across the surface of the substrate, or on a surface opposite the coating or film layer. The porous medium can be coupled to a pneumatic supply, such as to provide a gas cushion, or various porous media regions can be coupled to a pneumatic supply and a vacuum supply, respectively, to provide a gas cushion having a controlled "fly height," such as in one or more specified zones as mentioned above in relation to FIG. 7. When such porous medium is used to provide a distributed pressure supply to float the substrate above the chuck surface, the presence of holes for lift pins (e.g., for retracted lift pins) need not cause visible defects in a resulting coating produced while the substrate is supported by the gas cushion, therefore making a greater portion of the substrate area available for the active regions.

Figure 9:
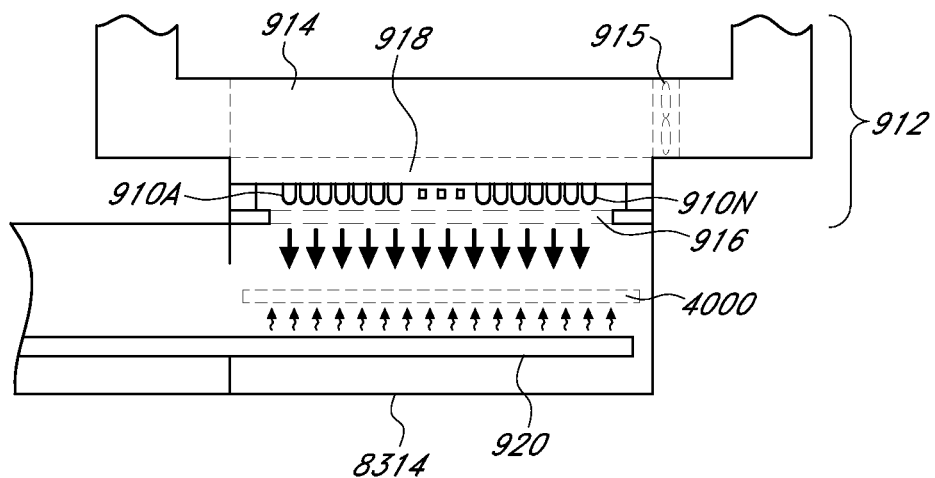
FIG. 9 illustrates generally an example of a diagram illustrating a treatment system, such as can be configured to expose a substrate to light (e.g., ultraviolet light), such as can be used in treating a coating on a substrate.

FIG. 9 illustrates generally an example of a diagram illustrating a treatment system, such as can be configured to expose a substrate to light, such as can be used in treating a coating on a substrate. The treatment system can be included as a portion of other systems or techniques described herein, such as for use in a curing process or to perform operations including one or more of baking or drying a liquid ink layer to solidify the liquid ink layer to provide a solid layer. The treatment system can include a light source assembly 912, such as configured to couple energy to a surface of a substrate 4000. The source assembly can include sources configured to emit one or more of ultraviolet (UV), infra-red (IR), or visible light. As in other examples, the treatment system 8314 can include a controlled environment, such as provided by one or more gas purification loops and coupled to one or more fan-filter-units (FFUs), such as to provide an environment having a specified maximum level of particulates or reactive contaminants.

The substrate 4000 can be conveyed to the treatment system 8314 such as using a floatation table conveyance arrangement as mentioned in relation to other examples described herein. A table 920 can be used to support the substrate 4000, such as using a gas cushion arrangement as mentioned in other examples. One or more lift pins can be used, such as to elevate the substrate 4000 further so that the substrate 4000 can be manipulated by an end effector of a handler after treatment (e.g., after formation of a patterned solid layer on the substrate 4000).

In an illustrative example involving ultraviolet treatment, the array of sources, such as sources 910A through 910N, can provide ultraviolet energy, such as including a wavelength selected from the range of about 350 nanometers to about 400 nanometers. For example, a wavelength of about 385 nanometers or about 395 nanometers can be used. The sources can include a variety of configurations, such as using relatively small number of high-power sources or using an array of relatively lower-power sources. The sources can include generally-available ultraviolet emitters, such as ultraviolet-emitting light-emitting diodes (UV LEDs) or one or more mercury-based devices, such as one or more mercury arc sources. In another example, the sources 910A through 910N can include lamps or other sources such as can emit one or more of visible or infra-red radiation. For example, the substrate can be heat treated such as using an array of infra-red emitting sources.

In an example, a substrate or housing 918 of the source assembly 912 can be liquid or air-cooled. For example, a plenum 914 can be provided, such as having one or more blowers such as a blower 915 to force air across or through a portion of the source assembly 912. Such a cooling loop can be separated from the controlled environment within the treatment system 8314. An environment surrounding the sources 910A through 910N can include the treatment system 8314 controlled environment, or the environment surrounding the sources 910A through 910N can form a separate enclosure, such as having a window 916 to allow energy to pass from the source enclosure to the treatment system 8314. In this manner, maintenance of the source enclosure need not disturb the controlled environment within the treatment system 8314.

The window 916 need not be uniformly transmissive. For example, the window can include or can be coupled to optics to converge, diverge, or collimate the energy. In another example, the window 916 can include transmission characteristics that vary in a specified manner over the area of the window, such as to invert or otherwise compensate for a non-uniform power density of delivered energy in the plane of the substrate 4000, such as within a specified region of the substrate. In the example of FIG. 9, the window and the sources 910A through 910N are shown as arranged in a planar configuration, but other configurations are possible, such as a cylindrical, parabolic, or spherical configuration. In an example the sources 910A through 910N can be used to treat one or more organic material layers to encapsulate a device being fabricated as a portion of the substrate 4000. Examples of such devices can include electronic circuits, solar cells, printed circuit boards, and flat panel displays. Such treatment can include providing a specified dose of ultraviolet energy within a specified range of wavelengths, and having a specified uniformity over a specified area of the substrate 4000.

A treatment process can generally be established in terms of a desired dose or dose-range of ultraviolet exposure, such as specified in terms of energy per unit area (e.g., Joules per square centimeter). Dose can be calculated such as by multiplying incident power density by exposure duration. A trade-off can exist between intensity (e.g., incident power) and exposure duration. For example, a relatively high-power source can be used and a desired dose can be achieved using a relatively short exposure duration, which beneficially shortens processing time. However, high-power UV irradiation, for example, may damage or degrade other portions of the display assembly, so a limit can exist as to the power density provided at the substrate by an ultraviolet source such as to avoid such damage or degradation.

A uniformity of delivered ultraviolet energy can also be controlled, such as to avoid variation in coating layer characteristics over a surface of the substrate 4000. Uniformity can be specified in terms of incident power or delivered dose, such as having a value of no more than 20% variation from highest to lowest incident power or dose over a specified curing area of the substrate 4000, or having no more than 50% variation from highest to lowest incident power or dose over the specified curing area of the substrate 4000, or having no more than 10% variation from highest to lowest incident power or dose over the specified curing area of the substrate 4000.

Various source configurations can be used for the sources 910A through 910N. For example, a linear array or "bar" source can be used as shown in the configuration 8315 of FIG. 10A. Such a bar configuration can include a precision reflector, such as to focus or collimate the energy in a direction towards the substrate 4000. In another example, such a bar configuration can include one or more of a diffuser or transmissive filter, or a two-dimensional array configuration can be used. One or more of these source configurations can be mechanically fixed, or can be scanned across a surface of the substrate. In such examples, either or both the substrate 4000 or the sources 910A through 910N can be scanned. For example, the sources 910A through 910N can be fixed, and the substrate 4000 can be repositioned, such as to create a relative motion between the substrate 4000 and the sources 910A through 910N to achieve scanning.

Figure 10A:
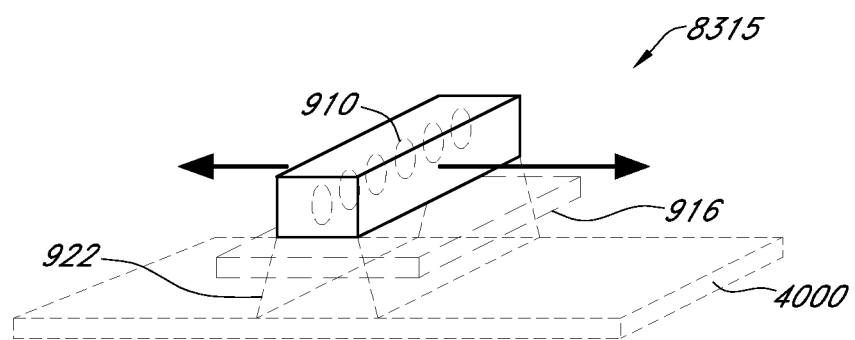
FIGS. 10A and 10B illustrate generally examples of at least a portion of a treatment system that can include a linear configuration of light sources, such as can be used in treating a coating on a substrate.
Figure 10B:
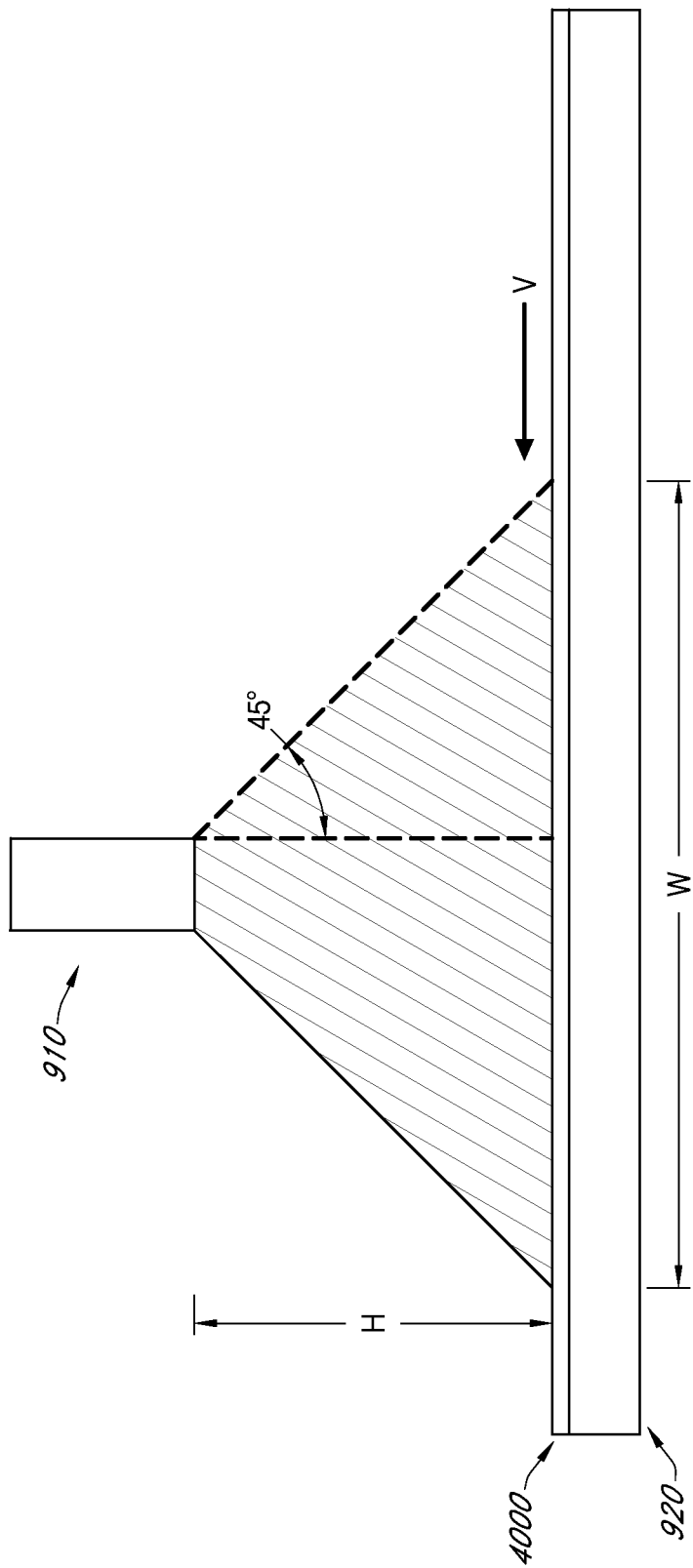

FIGS. 10A and 10B illustrate generally examples of at least a portion of a treatment system 8315 that can include a linear configuration of light sources, such as can be used in treating a coating on a substrate. In an example, the treatment system 8315 can include a linear array configuration 910 of sources. The linear array 910 can be scanned in at least one axis to sweep a beam of emission 922 (e.g., ultraviolet emission) across a specified region of the substrate 4000. In an illustrative, such a region can include a region where a liquid ink, which can be in an example an organic monomer-based ink, has been deposited and is to be cured or otherwise treated with ultraviolet light. Such scanning can be achieved through either or both of repositioning the substrate 4000 or the linear array 910, such as during treatment. A window 916 can be used, such as when the linear array 910 is located in an enclosure separate from a chamber 8314 housing the substrate 4000. Such a window 916 can include or can be coupled to one or more of optics or a filter.

The linear array 910 can offer an advantage of fewer sources (e.g., about 5 to about 10 UV LED sources, in an illustrative example). But, such a linear area 910 may result in additional system complexity where mechanical scanning is used to provide exposure to all of the specified area of the substrate 4000. Mechanical scanning can be simplified in part by specifying that the linear array 910 is at least as wide or as a long as one axis of the substrate. In this manner, an entire width or length of the substrate 4000 can be treated with light radiation while scanning the linear array 910 "gantry" only in a single axis. The linear array 910 can include a precision reflector configuration, as mentioned above. As an illustrative example, a high-power UV LED light bar supplying light at or near 395 nm wavelength is available from Phoseon Technology (Hillsboro, Oreg., USA), such as including a reflector configuration to enhance uniformity of a field illuminated by the linear array 910. In addition or instead of such a precision reflector, one or more of a filter or diffuser can be used, such as statically configured nearby the window 916 or included as a portion of the window 916. In another example, one or more of a filter or diffuser can be included as a portion of the linear array 910 assembly, such as mechanically scanned as a portion of the linear array 910. In an example, the power density supplied by the linear UV source is between 20 mW/cm$^2$ and 400 mW/cm$^2$.

In FIG. 10B, a linear array 910 source height from an upward-facing portion of the substrate 4000 can be represented by "H," a relative velocity between the optical energy emitted by the array 910 and the substrate can be represented by "V." The velocity can be established by moving one or more of the array 910 relative to the substrate 4000 (e.g., scanning the array mechanically) or the substrate 4000 relative to the array, such as by either floating the substrate on a cushion of gas or by moving a chuck 920 supporting the substrate. An illuminated width can be represented by "W," with such a width increasing as H increases and decreasing as H decreases. For dose modeling, a width of the array 910 can be multiplied by the illuminated width W to estimate an area of the substrate 4000 irradiated by the array 910.

Generally, in view of the large scale of substrates 4000 that can be accommodated by the examples described herein, throughput is a consideration. Accordingly, one objective can be to provide a light dose in a manner that the appropriate dose is delivered in a short or minimum amount of time, which can also reduce likelihood of damaging other portions of the substrate 4000 either through reducing or minimizing exposure to energy from the source, or merely through reducing or minimizing the time during which the substrate is being processed. However, a tradeoff can exist between various processing parameters such that the velocity, dose of energy, and source height H are generally not arbitrarily established.

The examples above mention various techniques for treatment of a substrate using light, such as to provide a solid coating layer by treating a printed liquid ink layer. Other treatment techniques can be used, such as can include one or more of heating or cooling the substrate, radiatively baking or drying the substrate use of higher pressure gas flow as compared to other portions of a coating system, use of vacuum (or partial vacuum), and combinations thereof. Such treatment can result in solidification of liquid ink to provide the solid layer through one or more of removal of a carrier fluid (e.g., one or more of drying or baking, such as including vacuum drying or vacuum baking), chemical reaction (e.g., cross linking or chemical transformation from one compound to another), or densification (e.g., baking, such as including vacuum baking). As mentioned in relation to other examples herein, temperature control can be achieve using one or more of a controlled temperature of pressurized gas use to support the substrate, or gas flow (e.g., laminar flow) such as established across a surface of the substrate, such as shown illustratively in relation to FIG. 13B.

Figure 11A:
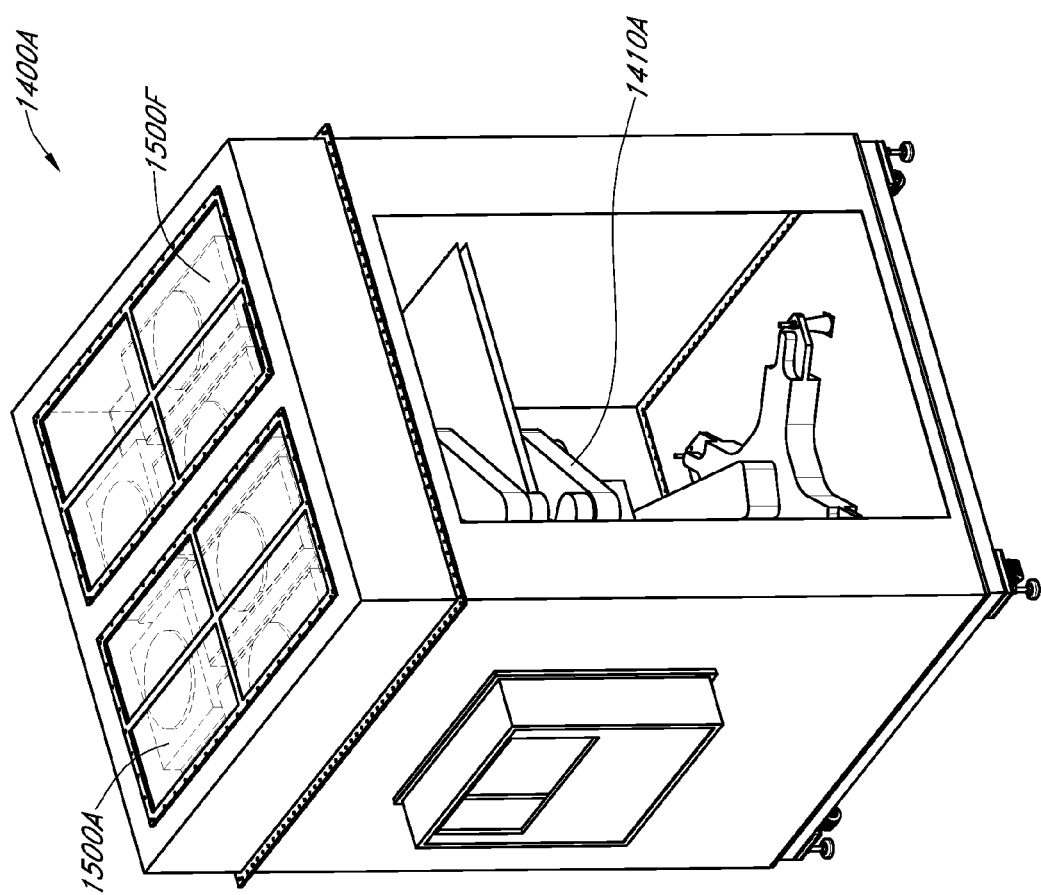
FIGS. 11A and 11B illustrate generally views a portion of a system, such as including a transfer module, that can be included as a portion of a coating system or can be used to manipulate a substrate before or after processing by a coating system.
Figure 11B:
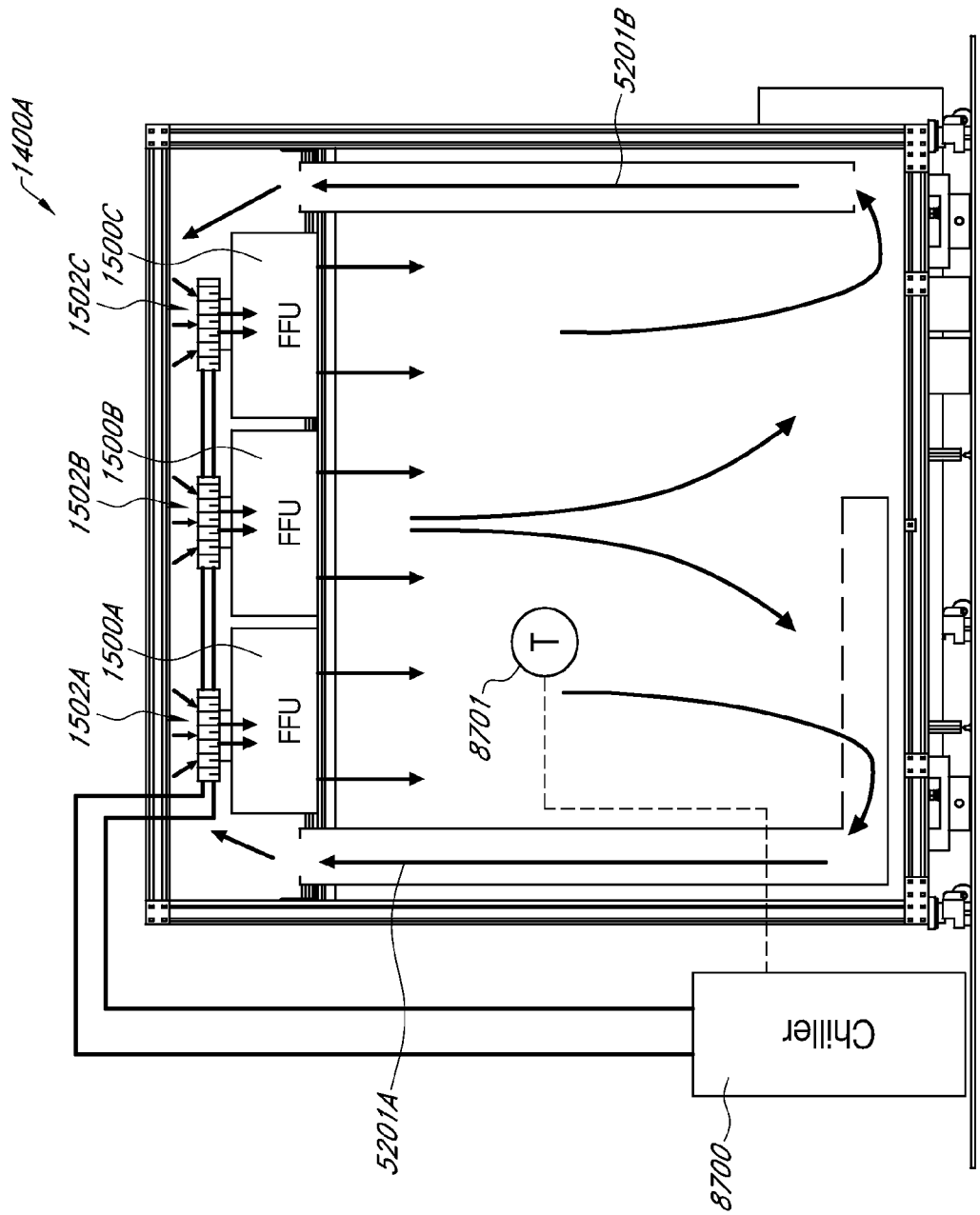

FIGS. 11A and 11B illustrate generally views a portion of a system, such as including a transfer module, that can be included as a portion of a coating system or can be used to manipulate a substrate before or after processing by a coating system. A controlled environment within various enclosures of a system can include a controlled particulate level. Particulates can be reduced or minimized such as by using air circulation units and filters, such as can be referred to as fan filter units (FFUs). An array of FFUs can be located along a path traversed by the substrate during processing. The FFUs need not provide a down-flow direction of air flow. For example, an FFU or ductwork can be positioned to provide a substantially laminar flow in a lateral direction across a surface of the substrate. Such laminar flow in the lateral direction can enhance or otherwise provide particulate control.

In the example of FIG. 11A or FIG. 11B, one or more fan filter units (FFUs), such as FFUs 1500A, 1500B, 1500C, through 1500F, can be used to assist in maintaining an environment within the transfer module 1400A having a controlled level of particulates or contaminants. Ducting such as first and second ducts 5201A or 5201B can be used, such as to provide a return air pathway as shown in the down-flow example of FIG. 11A. A controlled temperature can be maintained at least in part using a temperature controller 8700, such as coupled to one or more heat exchangers 1502. One or more temperature monitors, such as a temperature monitor 8701, can be placed in specified locations (e.g., on or nearby a substrate, such, or end effector) to provide feedback to assist in maintaining a substrate or a region nearby a substrate within a specified range of temperatures. In an example, as discussed below, the temperature monitor can be a non-contact sensor, such as an infrared temperature monitor configured to provide information indicative of a surface temperature sampled by the sensor. Other configurations are possible, such as can include placing the heat exchanger within or nearby a return air duct in a lower portion of the chamber as shown illustratively in FIG. 13B.

Figure 12:
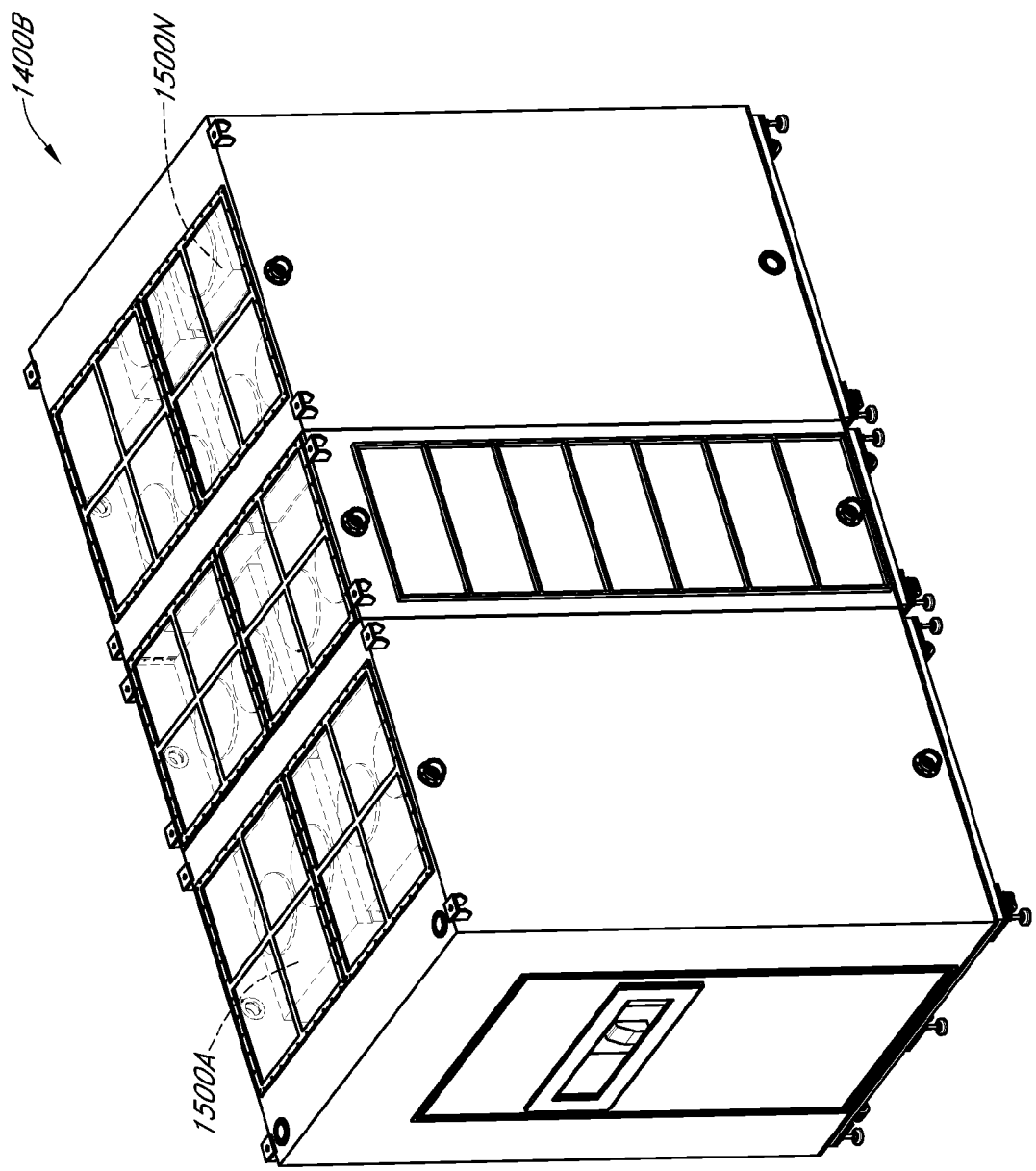
FIG. 12 illustrates generally a portion of a system such as including a further example of a transfer module, that can be included as a portion of a coating system or can be used to manipulate a substrate before or after processing by a coating system.

FIG. 12A illustrates generally a portion of a system such as including a further example of a transfer module, that can be included as a portion of a coating system or can be used to manipulate a substrate before or after processing by a coating system. As in the example of FIG. 11A, the transfer module 1400B can include one or more fan filter units (FFUs), such as 1500A through 1500N (e.g., 14 FFUs). By contrast with the handler 1410A of the transfer module 1400A of FIG. 11A, a handler within the transfer module 1400B can include a track configuration, such as to provide linear translation of the handler along an axis. A broad range of other chambers or modules can be coupled to the transfer module 1400B, such as in a clustered configuration, without requiring that each other module or chamber be coupled in a manner radiating out from a single point. One or more ducts can be located in portions of the transfer module 1400B in a region outside a range of motion of the handler. For example, such locations can be used to provide return ducts to bring a gas (e.g., nitrogen) from a lower portion of the transfer module 1400B upwards to a plenum above the FFU array.

Figure 13A:
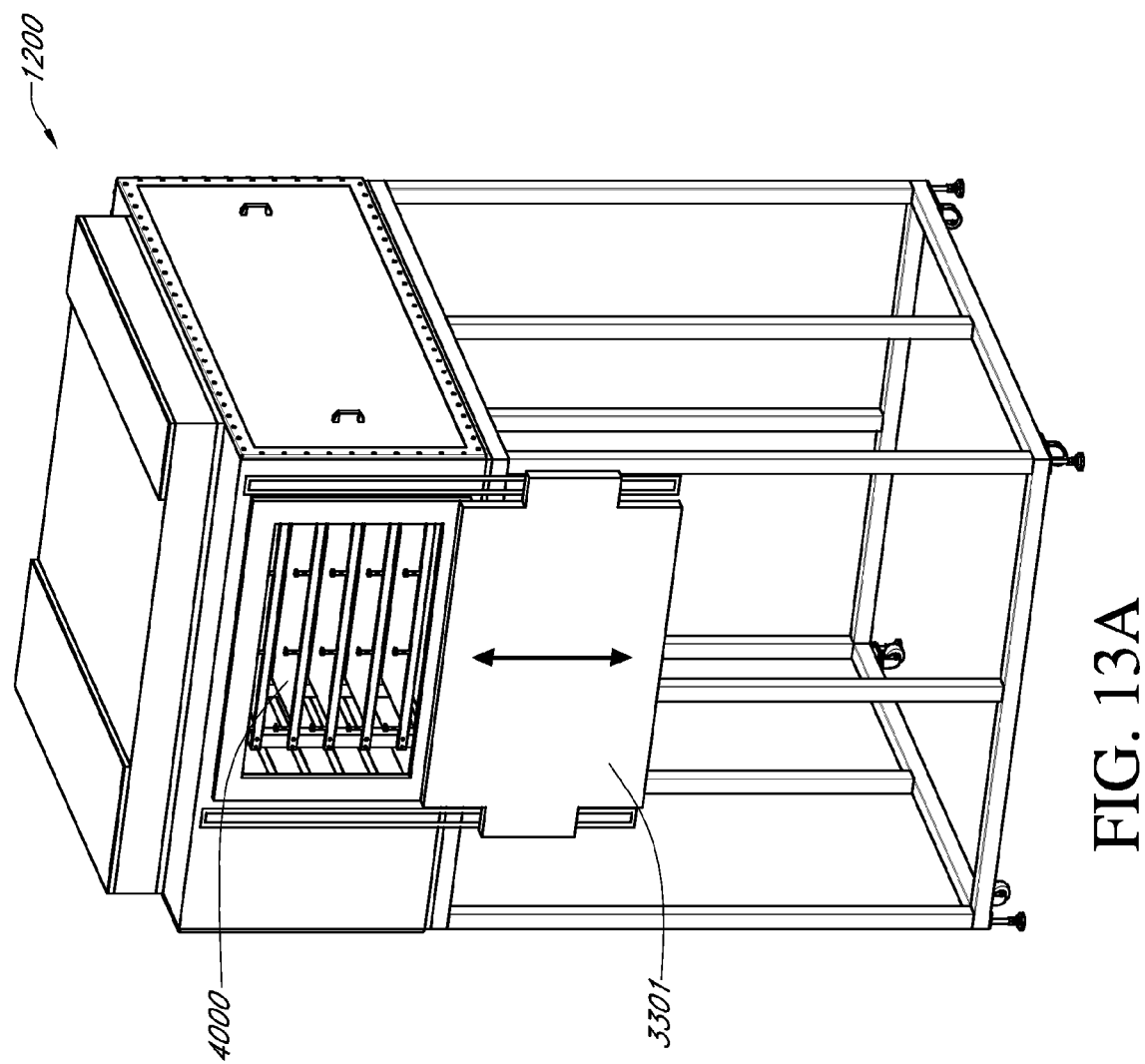
FIG. 13A and FIG. 13B illustrate generally views of a portion of a system, such as can include a stacked configuration of substrate processing areas that can be used in processing a substrate.
Figure 13B:
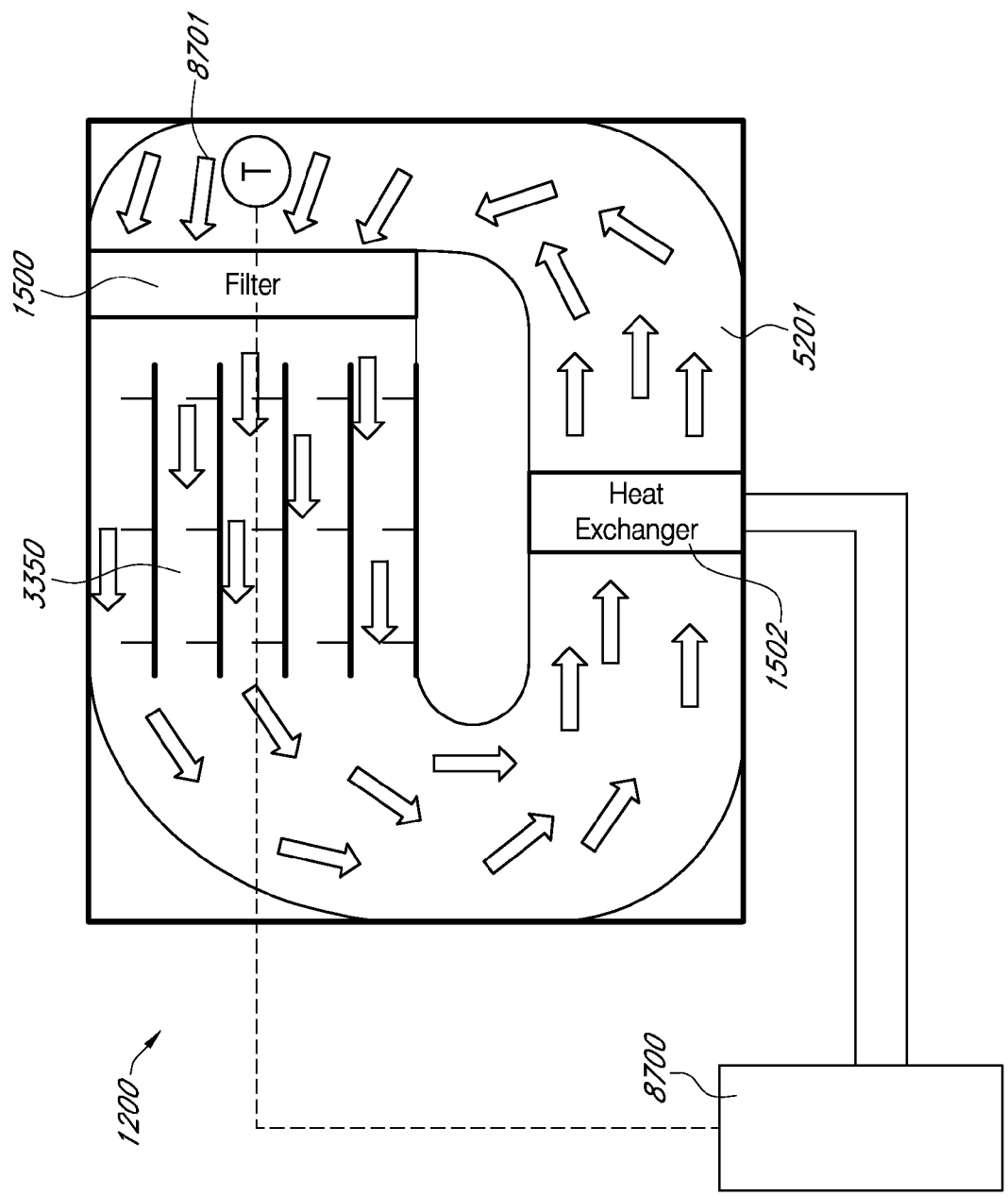

FIG. 13A and FIG. 13B illustrate generally views of a portion of a system, such as can include a stacked configuration of substrate 4000 areas that can be used in processing or holding a substrate. A port of the processing module 1200 can include one or more doors or hatches, such as a door 3301. For example, such doors can be mechanically or electrically interlocked so that a door accessible to an exterior of a fabrication system is unable to be opened unless a corresponding door elsewhere on or within the system is closed. For example, the door 3301 can be used to perform maintenance, while the processing module 1200 is otherwise isolated from an inert environment, or a particulate or contaminant-controlled environment in other enclosed portions of a fabrication system.

As mentioned above, a particulate or contaminant-controlled environment can be maintained at least in part using one or more FFUs 1500. In the example of FIG. 13B, a cross-flow configuration is used, such as to maintain a substantially laminar flow of gas (e.g., a non-reactive gas) across each of one or more cells 3350 that can include a substrate. A heat exchanger 1502 can, but need not be located nearby or as a portion of the FFU 1500. For example, the heat exchanger 1502 can be located below a substrate handling area, such as included within or as a portion of a return duct 5201. A temperature can be controlled by a temperature controller 8700, such as coupled to a temperature sensor 8701. The curved profile of portions of the duct 5201 can be specified at least in part using a computational fluid dynamics technique, such as to maintain specified flow characteristics (e.g., laminar flow) within the processing module 1200.

In addition to queuing substrates (or instead of queuing substrates), such as until another portion of the system is ready to receive such substrates, the processing module 1200 can functionally participate in the substrate fabrication process, for example by providing drying functions, or by holding the substrate for a specified duration (or until specified criteria are met) so as to allow the substrate to evolve from one condition to another. In the case of holding for the purpose of evolving the substrate, for example, the substrate can be held so as to allow for a liquid to settle or flow. A temperature of the substrate during such evolution can be controlled through the controlled application of temperature controlled gas flow across the substrate surface, such as laminar flow, which can be provided to flow across the plane of the substrate, as indicated in FIG. 13B.

In general, the holding module temperature need not be the same as the temperature of the environment in or surrounding other portions of the system. In another example, the substrate can rest on a cushion of temperature-controlled gas (similar to other examples described herein, such as where the substrate is supported using a floating cushion of gas for one or more of printing, holding, or other operations, such as a treatment operation including one or more of radiative baking or drying, convective baking or drying, or exposing the substrate to light such as to induce a chemical reaction, and combinations thereof.

In the case of drying a substrate in a processing module 1200, the controlled environment can provide for continuous removal of evaporated vapors via a vapor trap or gas recirculation and purification system, and the dying process can be further controlled through the controlled application of gas flow across the substrate surface, such as laminar flow, which can be provided to flow across the plane of the substrate, as indicated in FIG. 13B.

Various Notes & Examples

Example 1 can include or use subject matter (such as an apparatus, a method, a means for performing acts, or a device readable medium including instructions that, when performed by the device, can cause the device to perform acts), such as can include a method of providing a coating on a substrate, the method comprising transferring a substrate to a coating system configured to provide a solid layer in a specified region on a first side of the substrate, the solid layer coating at least a portion of the substrate, supporting the substrate in the coating system using a gas cushion provided to a second side of the substrate opposite the specified region, printing a liquid coating over the specified region of the substrate with the substrate located in a printing zone using a printing system while the substrate is supported by the gas cushion, conveying the substrate to a treatment zone including continuing to support the substrate using the gas cushion, and treating the liquid coating in the coating system to provide the solid layer upon the substrate in the specified region including continuing to support the substrate using the gas cushion.

Example 2 can include, or can optionally be combined with the subject matter of Example 1, to optionally include that the solid layer comprises at least a portion of an encapsulation structure, and that the substrate comprises electronic devices, the encapsulation structure established to encapsulate at least a portion of the electronic devices on the substrate.

Example 3 can include, or can optionally be combined with the subject matter of one or any combination of Examples 1 or 2 to optionally include that treating the liquid coating includes polymerizing the liquid coating.

Example 4 can include, or can optionally be combined with the subject matter of one or any combination of Examples 1 through 3 to optionally include holding the substrate for a specified duration after the printing the liquid coating including continuing to support the substrate using the gas cushion.

Example 5 can include, or can optionally be combined with the subject matter of Example 4, to optionally include conveying the substrate to a holding zone for the holding the substrate for the specified duration.

Example 6 can include, or can optionally be combined with the subject matter of Example 5, to optionally include using a holding zone configured to hold and support multiple substrates using the gas cushion.

Example 7 can include, or can optionally be combined with the subject matter of one or any combination of Examples 1 or 6 to optionally include that the treating the liquid coating includes irradiating the liquid coating with light.

Example 8 can include, or can optionally be combined with the subject matter of Example 7 to optionally include that the light includes ultraviolet (UV) light.

Example 9 can include, or can optionally be combined with the subject matter of Example 7 to optionally include that the irradiating the liquid coating with light includes radiatively baking the liquid coating.

Example 10 can include, or can optionally be combined with the subject matter of Example 7 to optionally include that the irradiating the liquid coating with light includes radiatively drying the liquid coating.

Example 11 can include, or can optionally be combined with the subject matter of one or any combination of Examples 1 through 10 to optionally include that the treating the liquid coating includes one or more of exposing the substrate to infra-red radiation or temperature-controlled gas flow.

Example 12 can include, or can optionally be combined with the subject matter of one or any combination of Examples 1 through 11 to optionally include that the specified region on the first side of the substrate overlaps with an active region of the substrate comprising an electronic device, and wherein the gas cushion is provided to the second side of the substrate opposite the active region.

Example 13 can include, or can optionally be combined with the subject matter of one or any combination of Examples 1 through 12 to optionally include that the conveying the substrate includes engaging or gripping the substrate using physical contact with the substrate.

Example 14 can include, or can optionally be combined with the subject matter of one or any combination of Examples 1 through 13 to optionally include that the gas cushion is established by forcing gas through a porous ceramic material to support the second side of the substrate above the porous ceramic material.

Example 15 can include, or can optionally be combined with the subject matter of one or any combination of Examples 1 through 14 to optionally include that the gas cushion in the printing zone is established using a combination of a pressurized gas region and at least a partial vacuum.

Example 16 can include, or can optionally be combined with the subject matter of Example 15, to optionally include that at least one of pressurized gas or evacuated gas used to establish the gas cushion is recovered and recirculated.

Example 17 can include, or can optionally be combined with the subject matter of one or any combination of Examples 1 through 16 to include, subject matter (such as an apparatus, a method, a means for performing acts, or a machine readable medium including instructions that, when performed by the machine, that can cause the machine to perform acts), such as can include a method of providing a coating on a substrate, the method comprising transferring a substrate to an enclosed coating system, the enclosed coating system configured to provide a solid layer in a specified region on a first side of the substrate, the solid layer coating at least a portion of an electronic device fabricated upon the substrate, supporting the substrate in the enclosed coating system using a gas cushion provided to a second side of the substrate opposite the specified region, printing a liquid coating over the specified region of the substrate with the substrate located in a printing zone including a printing system while the substrate is supported by the gas cushion, conveying the substrate to a treatment zone including continuing to support the substrate using the gas cushion, and treating the liquid coating in the treatment zone to provide the solid layer upon the substrate in the specified region including continuing to support the substrate using the gas cushion.

Example 18 can include, or can optionally be combined with the subject matter of Example 17, to optionally include that the treating the liquid coating includes one or more of baking or drying the liquid coating to provide the solid layer.

Example 19 can include, or can optionally be combined with the subject matter of Example 18, to optionally include that the treating the liquid coating includes one or more of exposing the substrate to infra-red radiation or temperature-controlled gas flow.

Example 20 can include, or can optionally be combined with the subject matter of one or any combination of Examples 17 through 19 to optionally include that the treating the liquid coating includes solidifying the liquid coating through one or more of inducing a chemical reaction or removing a carrier fluid included in the liquid coating.

Example 21 can include, or can optionally be combined with the subject matter of one or any combination of Examples 17 through 20 to optionally include that the solid layer comprises at least a portion of an encapsulation structure established to encapsulate at least a portion of the electronic device on the substrate.

Example 22 can include, or can optionally be combined with the subject matter of one or any combination of Examples 17 through 21 to optionally include conveying the substrate to a holding zone and holding the substrate for the specified duration including continuing to support the substrate using the gas cushion.

Example 23 can include, or can optionally be combined with the subject matter of one or any combination of Examples 1 through 22 to include, subject matter (such as an apparatus, a method, a means for performing acts, or a machine readable medium including instructions that, when performed by the machine, that can cause the machine to perform acts), such as can include a coating system for providing a solid layer on a substrate, the system comprising a platform configured to support the substrate using a gas cushion and configured to convey the substrate along the platform, a printing system configured to deposit a liquid coating in a specified region on a first side of the substrate when the substrate is located in a printing zone of the platform and while the substrate is supported by the gas cushion on a second side opposite the first side, a treatment system configured to treat the deposited liquid to provide a solid layer upon the substrate in the specified region when the substrate is located in a treatment zone of the platform and while the substrate is supported by the gas cushion, and that the platform is configured to support the substrate continuously during a printing operation in the printing zone and during a treatment operation in the treatment zone.

Example 24 can include, or can optionally be combined with the subject matter of Example 23, to optionally include that the solid layer comprises at least a portion of an encapsulation structure, and that the substrate comprises electronic devices, the encapsulation structure established to encapsulate at least a portion of the electronic devices on the substrate.

Example 25 can include, or can optionally be combined with the subject matter of one or any combination of Examples 23 or 24 to optionally include that the treatment system includes a source of light, the source configured to irradiate the liquid coating to provide the solid layer.

Example 26 can include, or can optionally be combined with the subject matter of Example 25, to optionally include that the source comprises an ultraviolet (UV) source.

Example 27 can include, or can optionally be combined with the subject matter of Example 25, to optionally include that the source comprises an infra-red source.

Example 28 can include, or can optionally be combined with the subject matter of one or any combination of Examples 23 through 25 to optionally include that the treatment system is configured to one or more of bake or dry the liquid coating to provide the solid layer.

Example 29 can include, or can optionally be combined with the subject matter of one or any combination of Examples 23 through 28 to optionally include that the treatment system is configured to solidify the liquid coating through one or more of inducing a chemical reaction or removing a carrier fluid included in the liquid coating.

Example 30 can include, or can optionally be combined with the subject matter of one or any combination of Examples 23 through 29 to optionally include that the platform is configured to hold the substrate for a specified duration after the printing operation and before the treatment operation including continuing to support the substrate using the gas cushion.

Example 31 can include, or can optionally be combined with the subject matter of Example 30, to optionally include that the platform includes a holding zone separate from the printing zone and the treatment zone, the holding zone configured to hold the substrate for the specified duration including continuing to support the substrate using the gas cushion.

Example 32 can include, or can optionally be combined with the subject matter of one or any combination of Examples 23 through 30 to optionally include an enclosure housing the printing system, the treatment system, and the platform including a controlled processing environment at or near atmospheric pressure and established to remain below specified limits of particulate contamination level, water vapor content, oxygen content, and ozone content.

Example 33 can include, or can optionally be combined with the subject matter of one or any combination of Examples 23 through 32 to optionally include that the specified region on the first side of the substrate overlaps with an active region of the substrate comprising an electronic device, and wherein platform is configured to provide the gas to the second side of the substrate opposite the active region.

Example 34 can include, or can optionally be combined with the subject matter of one or any combination of Examples 23 through 33 to optionally include that the platform is configured to convey the substrate including engaging or gripping the substrate using physical contact with the substrate.

Example 35 can include, or can optionally be combined with the subject matter of one or any combination of Examples 23 through 34 to optionally include that the gas cushion is established by forcing gas through a porous ceramic material to support the second side of the substrate above the porous ceramic material.

Each of the non-limiting examples described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including"

and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A coating system for providing a solid layer on a substrate, the system comprising:
   a platform configured to support the substrate using a gas cushion to float the substrate and configured to convey the substrate along the platform;
   a printing system configured to deposit a liquid coating in a specified region on a first side of the substrate when the substrate is located in a printing zone of the platform and while the substrate is supported by the gas cushion on a second side opposite the first side;
   a treatment system configured to treat the deposited liquid to provide a solid layer upon the substrate in the specified region when the substrate is located in a treatment zone of the platform and while the substrate is supported by the gas cushion;
   wherein the platform is configured to support the substrate continuously during a printing operation in the printing zone and during a treatment operation in the treatment zone.

2. The coating system of claim 1, wherein the solid layer comprises at least a portion of an encapsulation structure; and
   wherein the substrate comprises electronic devices, the encapsulation structure established to encapsulate at least a portion of the electronic devices on the substrate.

3. The coating system of claim 1, wherein the treatment system includes a source of light, the source configured to irradiate the liquid coating to provide the solid layer.

4. The coating system of claim 3, wherein the source comprises an ultraviolet (UV) source.

5. The coating system of claim 3, wherein the source comprises an infra-red source.

6. The coating system of claim 1, wherein the treatment system is configured to one or more of bake or dry the liquid coating to provide the solid layer.

7. The coating system of claim 6, wherein the treatment system is configured to solidify the liquid coating through one or more of inducing a chemical reaction or removing a carrier fluid included in the liquid coating.

8. The coating system of claim 1, wherein the platform is configured to hold the substrate for a specified duration after the printing operation and before the treatment operation including continuing to support the substrate using the gas cushion.

9. The coating system of claim 8, wherein the platform includes a holding zone separate from the printing zone and the treatment zone, the holding zone configured to hold the substrate for the specified duration including continuing to support the substrate using the gas cushion.

10. The coating system of claim 1, comprising an enclosure housing the printing system, the treatment system, and the platform including a controlled processing environment at or near atmospheric pressure and established to remain below specified limits of particulate contamination level, water vapor content, oxygen content, and ozone content.

11. The coating system of claim 1, wherein the specified region on the first side of the substrate overlaps with an active region of the substrate comprising an electronic device, and wherein platform is configured to provide the gas to the second side of the substrate opposite the active region.

12. The coating system of claim 1, wherein the platform is configured to convey the substrate including engaging or gripping the substrate using physical contact with the substrate.

13. The coating system of claim 1, wherein the gas cushion is established by forcing gas through a porous ceramic material.

* * * * *